(12) United States Patent
Trecarichi et al.

(10) Patent No.: US 9,130,366 B2
(45) Date of Patent: Sep. 8, 2015

(54) ELECTRONIC IGNITION SYSTEM FOR AN ENGINE OF A VEHICLE IN CASE OF FAILURE

(71) Applicant: STMicroelectronics S.r.l., Agrate Brianza (MI) (IT)

(72) Inventors: Calogero Andrea Trecarichi, Aci Catena (IT); Giovanni Luca Torrisi, Aci Catena (IT); Donato Tagliavia, Acireale (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 247 days.

(21) Appl. No.: 13/901,460

(22) Filed: May 23, 2013

(65) Prior Publication Data

US 2013/0335864 A1     Dec. 19, 2013

(30) Foreign Application Priority Data

May 23, 2012    (IT) .............................. MI2012A0893

(51) Int. Cl.
| | |
|---|---|
| H02H 9/04 | (2006.01) |
| F02P 3/05 | (2006.01) |
| F02P 3/055 | (2006.01) |
| F02P 9/00 | (2006.01) |
| H03K 17/16 | (2006.01) |
| F02D 41/14 | (2006.01) |
| F02D 41/00 | (2006.01) |

(52) U.S. Cl.
CPC ................ *H02H 9/041* (2013.01); *F02P 3/051* (2013.01); *F02P 3/055* (2013.01); *F02P 9/002* (2013.01); *H03K 17/166* (2013.01); *H03K 17/168* (2013.01); *F02D 41/00* (2013.01); *F02D 41/1479* (2013.01)

(58) Field of Classification Search
CPC .......... H02H 9/041; F02P 3/055; F02P 9/002; H03K 17/166; H03K 17/168; F02D 41/00; F02D 41/1479
USPC ........................................................... 361/35
See application file for complete search history.

(56) References Cited

U.S. PATENT DOCUMENTS

| | | | |
|---|---|---|---|
| 5,045,964 A * | 9/1991 | Bennett et al. ................ | 361/254 |
| 6,310,331 B1 | 10/2001 | Nance et al. | |
| 6,336,448 B1 | 1/2002 | Furuhata et al. | |
| 6,684,867 B2 | 2/2004 | Ito et al. | |
| 6,807,042 B2 | 10/2004 | Spampinato et al. | |
| 2006/0022609 A1 * | 2/2006 | Yukutake et al. .......... | 315/209 T |
| 2006/0077000 A1 | 4/2006 | Goudo | |

OTHER PUBLICATIONS

Italian Search Report from corresponding Italian Application No. MI2012A000893 dated Feb. 12, 2013.

* cited by examiner

*Primary Examiner* — Thienvu Tran
*Assistant Examiner* — Kevin J Comber
(74) *Attorney, Agent, or Firm* — Allen, Dyer, Doppelt, Milbrath & Gilchrist, P.A.

(57) ABSTRACT

An electronic system to discharge a transformer in case of a failure during a charging phase of the transformer. The system includes the transformer having a primary winding with a first terminal connected to a battery voltage and with a second terminal for generating a primary voltage signal, includes a switch serially connected to the primary winding and having a control terminal carrying a control voltage signal for opening or closing the switch and includes an electronic circuit. The electronic circuit further includes a current generator and a voltage clamping.

13 Claims, 11 Drawing Sheets

ELECTRONIC IGNITION SYSTEM FOR AN ENGINE OF A VEHICLE IN CASE OF FAILURE

CROSS REFERENCE TO RELATED APPLICATIONS

This application claims the priority benefit of Italy patent application serial number MI2012A000893, filed on May 23, 2012, which is hereby incorporated by reference to the maximum extent allowable by law.

BACKGROUND

1. Technical Field

The present disclosure generally relates to the electronics field. More in particular, the present disclosure concerns an electronic ignition system for an engine of a vehicle in case of failure during a charging phase of the the coil.

2. Discussion of the Related Art

It is known that most of the electronic ignition systems for the engine of motor vehicles are of the inductive-type. An inductive-type ignition system comprises a battery for supplying energy, a coil having a primary winding with a terminal connected to the battery, a switch connected between the other terminal of the primary winding and ground and a spark plug connected to the secondary winding of the coil. The coil is a transformer which is such to generate a voltage across the secondary winding greater than the voltage across the primary winding.

The inductive-type ignition system operates in the following way. A control unit sends a control signal which closes the switch and starts the charge of the energy into the primary winding: it is generated a current flow from the battery towards ground crossing the primary winding and having an increasing trend, thus storing energy into the primary winding. During the charging phase the control unit calculates the instants wherein the spark at the spark plug can occur, by taking into account information relating the operation of the engine obtained by means of suitable sensors: for example, the instant wherein the spark can occur is when the compression in the cylinder has reached the maximum value. Moreover, the spark can occur only at the instants calculated by the control unit because, otherwise, serious failures in the engine or to different engine components can occur. Therefore at the calculated instants the control unit sends the control signal which opens the switch, which abruptly interrupts the flow of the charge current through the primary winding of the coil, which causes a short length voltage pulse in the primary winding, typically with a peak value of 350-400 V and having a length of few micro-seconds. This voltage pulse generated in the secondary winding of the coil a voltage pulse having a greater value, typically of 35-40 kV, which is sufficient for generating the spark between the electrodes of the plug, so that the air/fuel mixture received in the engine cylinder is burnt.

Moreover, it is known to implement the switch (which enables or interrupts the flow of the charge current through the primary winding) with a Bipolar Junction Transistor (BJT) or with an Insulated Gate Bipolar Transistor (IGBT), which operate in the saturation region when are closed and in the cut off region when they are open (for example, see U.S. Pat. No. 6,807,042 for BJT and U.S. Pat. No. 6,684,867 for IGBT). One of the reasons why it is advantageous to implement the switch with the transistor IGBT is that it is capable of tolerating high currents and voltages of high value (in the example, 350-400 V), typically used in the electronic ignition systems; moreover, the switching rate of the IGBT transistor is lower than the one of other devices (for example, MOSFET), but this is not a limiting factor because the electronic ignition systems use low frequencies.

It is possible that failures occur during the phase of charging the primary winding of the coil. Some examples of failures are the following:

an increase of the value of the temperature internal to the device in which the ignition system is implemented above a threshold value;

over-voltages of the battery voltage or of logic signals (for example, a short-circuit of the control signal with the battery voltage);

a maximum value of the current through a load is reached;

a disconnection of the inter-bonding wires in case the electronic ignition system is implemented with a integrated circuit of the hybrid-type, that is when the controller and the power stage are implemented into different devices which are connected each other with the inter-bonding wires inside the same package.

Protection systems which have the function to shut-down the electronic ignition in case one or more failures occur during the charging phase of the primary winding are known. For example, if the failure is the temperature increase of the device to a value greater than the threshold value, it is necessary to shut-down the device for preventing it from being damaged and thus it is necessary to shut-down the electronic ignition.

The shut-down of the electronic ignition should occur safely, that is it's necessary to discharge the energy stored into the primary winding for preventing the spark from occurring between the plug electrodes at time instants different from those calculated by the control unit; in fact, as previously explained, the spark can occur only at particular instants calculated by the control unit, otherwise serious failures can occur to the engine or to different engine components.

Therefore, if a failure occurs during the charging phase of the primary winding, it is necessary to gradually discharge the energy stored into it by gradually reducing the value of the charge current flowing through the primary winding of the coil and thus by controlling the value of the voltage drop across the primary winding, by keeping at the same time limited the peak values of the voltage drop across the primary winding, in order to avoid the generation of voltage pulses across the secondary winding having abrupt variations and having peak values which are sufficient to generate spurious sparks between the plug electrodes. In the known approaches this is obtained by a linear discharge of the control voltage or current of the switch; consequently, the current flowing through the primary winding of the coil (and thus in the switch) slowly decreases causing the voltage drop across the primary winding to gradually decrease, thus avoiding the generation of spurious sparks. Since the control voltage or current value decrease should be very slow for preventing the generation of the spurious sparks, it is necessary a long time interval before that the value of the charge current through the primary winding of the coil (and thus the value of the voltage drop across the primary winding) starts decreasing and thus a long time interval is necessary (for example, 10-20 milliseconds) from the instant wherein the failure is detected and the time instant wherein the value of the charge current through the primary winding of the coil (and thus the value of the voltage drop across the primary winding) starts decreasing: this time range can be too long and thus it can cause electronic and/or mechanical-type failures (for example, in case of thermal protection the temperature of the device continues to increase during said time interval and the device can be damaged).

In the particular case wherein the switch is implemented with a BJT transistor, it is necessary to extract the current from the base of the BJT transistor towards ground in order to gradually decrease the value of the voltage drop across the primary winding and at the same time to limit the peak value of the voltage drop across the primary winding, by slowly decreasing the value of the charge current flowing through the primary winding (and through the BJT transistor) and increasing the value of the voltage on the collector terminal, in order to prevent the generation of spurious sparks between the electrodes of the spark plug. This known solution has the above mentioned disadvantage of requiring a long time interval between the instant wherein the failure is detected and the time instant wherein the current value through the primary winding of the coil (and thus the value of the voltage drop across the primary winding) starts decreasing.

In the particular case wherein the switch is implemented with an IGBT transistor, it is necessary to control the voltage value at the gate terminal of the IGBT transistor in order to slowly decrease the voltage value at the gate terminal, thus gradually reducing the value of the voltage drop across the primary winding and at the same time limiting the peak value of the voltage drop across the primary winding, thus avoiding the generation of spurious sparks between the electrodes of the plug. This known solution has the previously indicated disadvantage of requiring a long time interval between the instant wherein the failure is detected and the time instant wherein the current value through the coil primary winding (and thus the value of the voltage drop across the primary winding) starts decreasing; during this time interval having a high value the charge current continues to further increase without control till reaching high peak values. Moreover, the known solution with the IGBT transistor has the further disadvantage of not enabling to reliably prevent the generation of the spark (or of spurious sparks) at time instants different from those calculated by the control unit, due to the high transconductance of the IGBT transistor. In fact, small variations of the voltage value at the gate terminal of the IGBT transistor are sufficient to generate a relevant variation of the current value flowing in the collector of the IGBT transistor, thus generating a relevant variation of the voltage at the collector of the IGBT transistor and thus a relevant variation of the voltage drop across the primary winding of the coil, consequently causing a variation of the voltage drop across the secondary winding which is sufficient to generate a spark between the plug electrodes, which can cause serious failures to the engine or to different engine components.

Moreover, the known solutions do not enable to accurately control the decreasing trend of the voltage drop across the primary winding of the coil during the phase of discharging the energy stored into the primary winding after the detection of the failure, with the disadvantage that abrupt variations of the voltage at the primary winding terminal can occur and consequently abrupt variations of the voltage at the terminal of the secondary winding, thus causing undesired sparks between the plug electrodes.

SUMMARY

Embodiments relate to an electronic system for discharging a transformer in case of a failure during a charging phase of the transformer as defined in the claims.

The Applicant has perceived that the electronic system according to the embodiments has the following advantages:

it reduces the time interval between the instant wherein the failure is detected and the instant wherein the voltage drop across the primary winding is clamped to a predetermined value, thus allowing a fast activation of the protection systems (for example, of the thermal type) and thus preventing the current flowing through the primary winding from reaching high peak values (in the example of the thermal-type, the device is prevented from reaching high temperatures);

it is possible to discharge the energy stored into the primary winding of the coil by accurately controlling the trend of the voltage drop across the primary winding of the transformer, thus preventing the generation of undesired sparks during the safety shut-down of the electronic ignition;

in case the switch is implemented with an IGBT transistor, it is possible to reliably avoid the generation of undesired sparks during the shut-down of the electronic ignition.

Embodiments also provide an integrated circuit as defined in the claims.

Embodiments also provide a vehicle, in particular a motor vehicle, as defined in the claims.

Embodiments also provide a method for discharging a transformer in case of failure during a charging phase of the transformer, as defined in the claims.

BRIEF DESCRIPTION OF THE DRAWINGS

Further characteristics and advantages of the embodiments will be better understood from the following description of an embodiment and of its variants provided in an exemplifying way with reference to the attached drawings, wherein.

DETAILED DESCRIPTION

Figure 1:
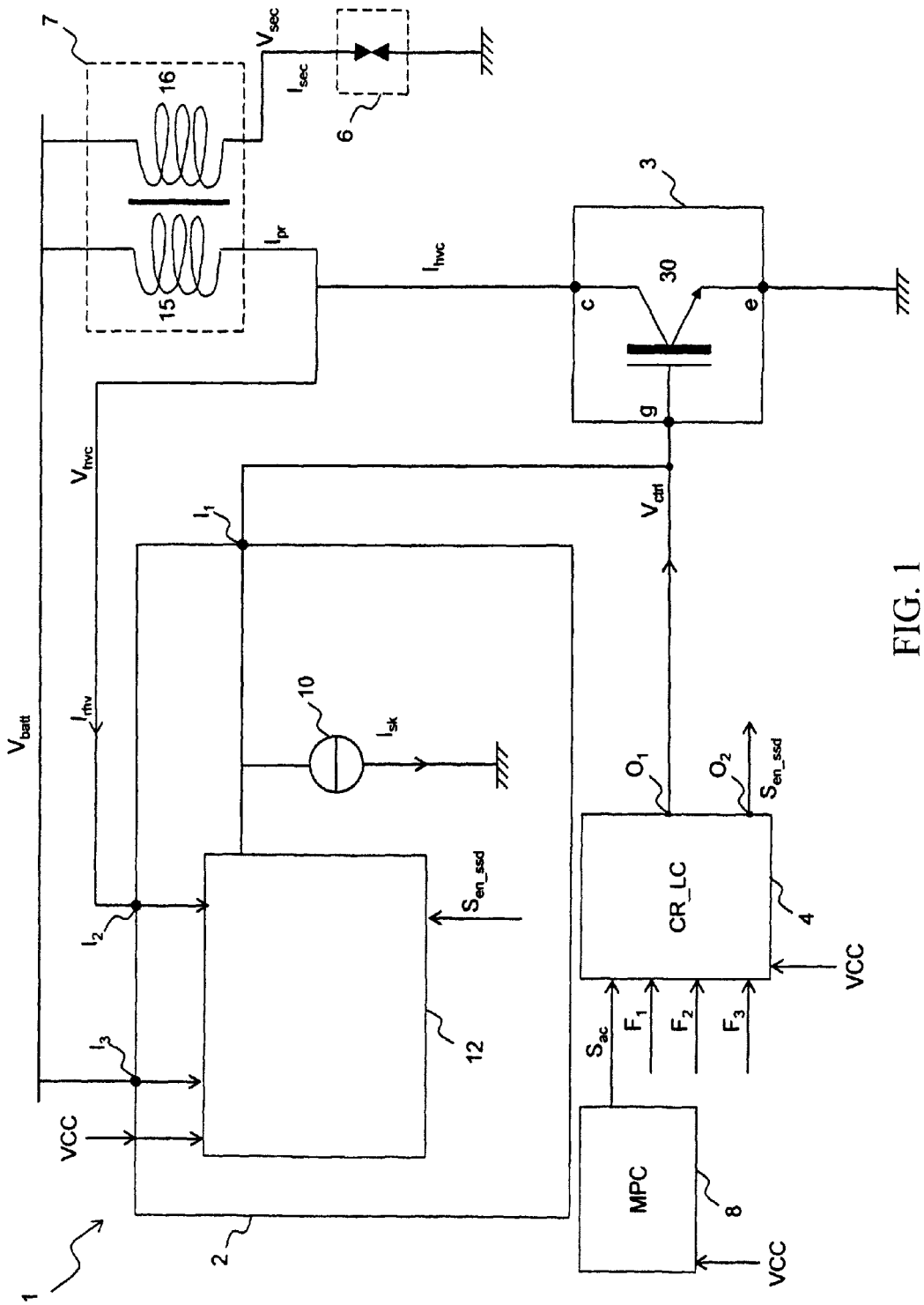
FIG. 1 schematically shows an electronic ignition system for the engine of a vehicle according to an embodiment.

With reference to FIG. 1, there is shown an electronic ignition system 1 for the engine of a vehicle (for example, a car) according to an embodiment.

The electronic ignition system 1 comprises a coil 7, a switch 3, a spark plug 6, a microprocessor 8, a logic circuit 4, and an electronic protection circuit 2.

The microprocessor 8, the logic circuit 4 and the electronic protection circuit 2 are supplied by a low supply voltage VCC (for example, the VCC value is comprised between 3.3 V and 5 V).

The electronic ignition system 1 is such to have a charging phase, a turn-on phase and a safety discharging phase.

In the charging and turn-on phases the electronic protection circuit 2 is disabled and in the safety discharging phase the electronic protection circuit 2 is enabled.

During the charging phase the coil 7 primary winding 15 stores energy and in the turn-on phase the spark between the electrodes of the plug 6 is generated, thus burning the air/fuel mixture contained in the engine cylinder.

During the safety discharging phase the electronic protection circuit 2 is enabled and performs, by means of the switch 3, the discharge of the energy stored into the primary winding 15 of the coil 7 in order to safely shut-down the electronic ignition system 1, thus avoiding the generation of the spark (and of undesired sparks) between the electrodes of plug 6.

Therefore "safety shut-down" of the electronic ignition system 1 means in the present description that the energy previously stored into the primary winding 15 of coil 7 is not discharged over the secondary winding 16 of coil 7, but is discharged through the switch 3 by means of the electronic protection circuit 2 and thus it is avoided the generation of the spark between the electrodes of the plug 6 at time instants different from those calculated by the microprocessor 8.

Some examples of failures which can occur, are the following:

an increase of the value of the temperature inside the device in which the electronic ignition system 1 is implemented above a threshold value;

over-voltages of the battery voltage $V_{batt}$ or of logic signals (for example, a short circuit of the control voltage signal $V_{ctrl}$ with the battery voltage $V_{batt}$);

the primary current $I_{pr}$ flowing through the primary winding 15 reaches a maximum value;

disconnection of inter-bonding wires (for example used for temperature and/or current sensors of an IGBT transistor 30 which implements the switch 3) when the electronic ignition system 1 is implemented by a hybrid-type integrated circuit, that is wherein the logic circuit 4 and the electronic protection circuit 2 are implemented by a device different from the device implementing the switch 3 and the two devices are connected each other with inter-bonding wires inside the same package.

Coil 7 comprises the primary winding 15 having a first terminal connected to a battery voltage $V_{batt}$ (for example equal to 12 V) and a second terminal connected to switch 3 and such to generate a primary voltage signal $V_{hvc}$; coil 7 further comprises a secondary winding 16 having a first terminal connected to the battery voltage $V_{batt}$ and a second terminal connected to an electrode of the spark plug 6 and such to generate a secondary voltage signal $V_{sec}$, wherein the voltage drop across the secondary winding 16 is greater than the voltage drop across the primary winding 15.

Switch 3 is serially connected to the primary winding 15; in particular, switch 3 comprises a first terminal c connected to the second terminal of the primary winding 15, comprises a second terminal e connected to a ground voltage reference and comprises a third control terminal g for receiving a control voltage signal $V_{ctrl}$ which has the function of driving the opening or closing of the switch 3. A current $I_{hvc}$ flows through the switch 3 when is closed.

Preferably, the switch 3 is an IGBT-type transistor 30 (Insulated Gate Bipolar Transistor) having the collector terminal c connected to the second terminal of the primary winding 15, having the emitter terminal e connected to the ground voltage reference and having the gate terminal g receiving the control voltage signal $V_{ctrl}$. In particular, IGBT transistor 30 has a first threshold voltage $V_{th}$ and it is such to operate in the saturation region when is closed and in the cut off region when is open; this is obtained by choosing a suitable value of the low supply voltage VCC so that the IGBT transistor 30 is such to operate in the saturation region when the voltage at the gate terminal g is equal to the low supply voltage VCC, is such to operate in the linear region when the current flowing through the collector terminal c is controlled by the difference between the voltage value at gate terminal g and value of the first threshold voltage $V_{th}$ and is such to operate in the cut off region when the voltage value at the gate terminal g is lower than the value of the first threshold voltage $V_{th}$. In this case the first terminal c of switch 3 is the collector terminal of the IGBT transistor 30 and it will be indicated in the following with "collector terminal c", the current $I_{hvc}$ is the current flowing through the collector terminal c of IGBT transistor 30 and it will be indicated in the following "collector current $I_{hvc}$", the primary voltage signal $V_{hvc}$ is the voltage at collector terminal c of the IGBT transistor 30 and it will be indicated in the following "collector voltage $V_{hvc}$", the second terminal e of the switch 3 is the emitter terminal of the IGBT transistor 30 and it will be indicated in the following with "emitter terminal e", the third control terminal g of the switch 3 is the gate terminal of the IGBT transistor 30 and it will be indicated in the following with "gate terminal g", the control voltage signal $V_{ctrl}$ is the voltage at gate terminal and it will be indicated in the following with "gate voltage $V_{ctrl}$".

The spark plug 6 comprises a first electrode connected to the second terminal of the secondary winding 16 and a second electrode connected to the ground.

The microprocessor 8 has the function of calculating the instants at which the spark between the plug 6 electrodes can occur, by taking into account information relating the operation of the vehicle engine obtained by means of suitable sensors: for example, the instant wherein the spark can occur is one wherein the cylinder compression has reached the maximum value. The microprocessor 8 comprises an output terminal for generating a turn-on signal $S_{ac}$ having a transition from a first logic value to a second logic value (for example, a transition from low to high) at the instants of starting the charging phase of the primary winding 15 of coil 7 and has a transition from the second logic value to the first logic value (in the example, a transition from high to low) at the instants calculated by the microprocessor 8 wherein the spark can occur between the electrodes of the plug 6.

The logic circuit 4 has the function of controlling the opening or closing of the switch 3 and the function of enabling or disabling the operation of the electronic protection circuit 2 in order to safely shut-down the electronic ignition system 1. In particular, the logic circuit 4 comprises:

an input terminal connected to the output terminal of the microprocessor 8 and such to receive the turn-on signal $S_{ac}$;

one or more input terminals for receiving one or more failure signals $F_1$, $F_2$, $F_3$ indicating one or more respective failures occurring during the charging phase of the primary winding 15;

a first output terminal $O_1$ connected to the third control terminal g of switch 3 and such to generate, as a function of the turn-on signal $S_{ac}$ and of the failure signals $F_1$, $F_2$, $F_3$, the control voltage signal $V_{ctrl}$ for controlling the closing or opening of the switch 3;

a second output terminal $O_2$ such to generate, as a function of the turn-on signal $S_{ac}$ and of the failure signals $F_1$, $F_2$, $F_3$, a safety shut-down enable signal $S_{en\_ssd}$ having a first value (for example, a transition from a low to a high logic value) for enabling the electronic protection circuit 2 (and thus for activating the safety discharging phase) and having a second value (in the example, a transition from the high to the low logic value) for disabling the electronic protection circuit 2 (and thus for de-activating the safety discharging phase and activating the charging phase).

In particular, the logic circuit 4 is such to receive the turn-on signal $S_{ac}$ having the second logic value (in the example, high) indicating the charging phase of the primary winding 15, is such to detect one or more failure signals $F_1$, $F_2$, $F_3$ indicating one or more respective failures and, as a function of them, is such to generate the safety shut-down enable signal $S_{en\_ssd}$ having a transition from a first to a second logic value (for example, from low to high) for enabling the operation of the electronic protection circuit 2 and performing the safety shut-down of the electronic ignition system 1 by discharging the energy stored into the primary winding 15 by means of the electronic protection circuit 2, as it will be explained in more detail in the following in the description relating to the operation.

Moreover, the logic circuit 4 is such to receive the turn-on signal $S_{ac}$ having a transition from the first to the second logic value indicating the start of the charging phase of the primary winding 15, is such to detect one or more failure signals $F_1$, $F_2$, $F_3$ indicating the absence of failures and, as a function of them, is such to activate the charging phase and is such to generate the control voltage signal $V_{ctrl}$ having a high voltage value (for example, equal to the low supply voltage VCC) for closing the switch 3 and is such to generate the safety shut-down enable signal $S_{en\_ssd}$ having a second logic value (in the example, low) for disabling the operation of the electronic protection circuit 2; in this case it starts the phase of charging energy into the primary winding 15 and a primary current $I_{pr}$ flows through the primary winding 15 and the current $I_{hvc}$ flows through the switch 3.

Moreover, in the turn-on phase the logic circuit 4 is such to receive the turn-on signal $S_{ac}$ having a transition from the second to the first logic value indicating the instant wherein the spark can occur, is such to detect one or more failure signals $F_1$, $F_2$, $F_3$ indicating the absence of failures and, as a function of them, is such to generate the control voltage signal $V_{ctrl}$ having a low voltage value (for example, 0 V) for opening the switch 3: in this case, the flow of the primary current $I_{pr}$ through the primary winding 15 is interrupted and a short length voltage pulse in the primary winding is generated (typically, having a peak value of 350-400 V and a length of few micro-seconds), which generates in the secondary winding 16 of the coil 7 a voltage pulse having a greater value (typically having a value of 35-40 kV), which is sufficient to generate the spark between the electrodes of the plug 6, so that the air/fuel mixture contained in the vehicle engine cylinder is burnt.

The electronic protection circuit 2 has the function of safely shutting-down the electronic ignition system 1, that is of performing the discharge of the energy stored into the primary winding 15 of coil 7 in case a failure occurs during the phase of charging of the primary winding 15 in order to prevent the generation of the spark (or of undesired sparks) at the plug 6 at time instants different from those calculated by microprocessor 8.

With reference to FIG. 1, the electronic protection circuit 2 comprises:

a first driving terminal $I_1$ connected to the third control terminal g of the switch 3 (and thus also connected to the output terminal of the logic circuit 4) and such to carry the control voltage signal $V_{ctrl}$;

a second terminal $I_2$ connected to the second terminal of the primary winding 15 and such to receive the primary voltage signal $V_{hvc}$, and such to carry a slow discharge current $I_{rhv}$;

a third input terminal $I_3$ for receiving the battery voltage $V_{batt}$.

In particular, the electronic protection circuit 2 comprises a current generator 10 and a voltage clamping circuit 12, which are supplied by the low supply voltage VCC.

Figure 3A:
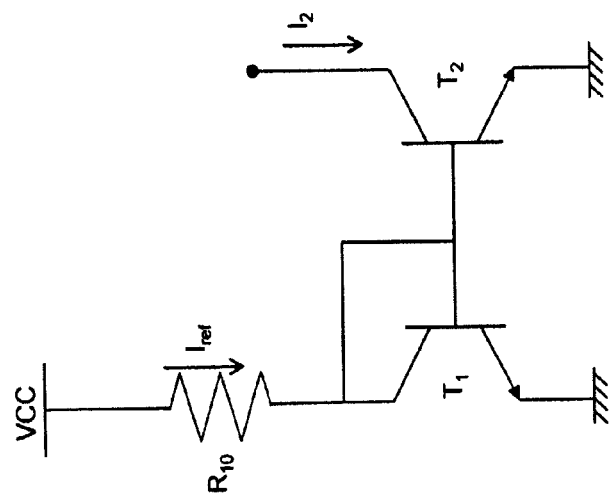
FIGS. 3A-3B show an example of a current amplifier or current generator used in the electronic protection circuit according to an embodiment.
Figure 3B:
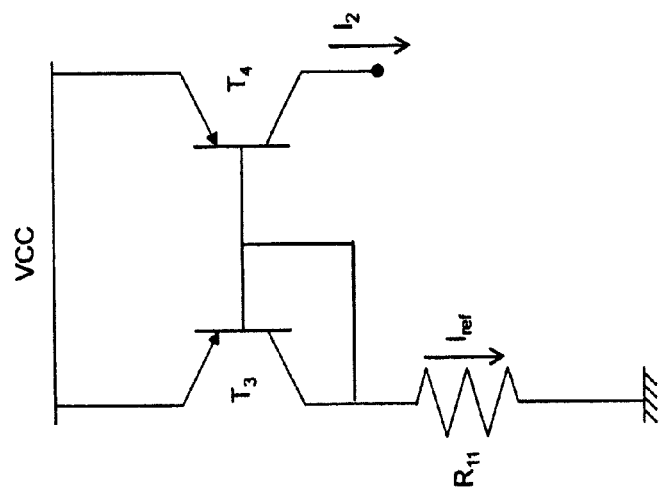

The current generator 10 is implemented, for example, with a current mirror using two npn-type bipolar transistors T1, T2 and a resistor $R_{10}$ (as shown in FIG. 3A, wherein $I_2 = I_{sk}$), or with a current mirror using two pnp-type bipolar transistors T3, T4 and a resistor $R_{11}$ (as shown in FIG. 3B, wherein $I_2 = I_{sk}$).

The safety discharging phase comprises a first fast discharging phase and a second slow discharging phase.

In the first fast discharging phase the current generator 10 has the function of generating a fast discharge current $I_{sk}$ from the first driving terminal $I_1$ towards ground (see the arrow shown in FIG. 2C), in order to reduce the time interval comprised between the instant (see $t_3$ in FIG. 4A) wherein the failure is detected and the instant (see $t_4$ in FIG. 4A) wherein the value of the primary voltage signal $V_{hvc}$ (and thus the voltage drop across the primary winding 15) is clamped to a predetermined value, thus reducing the intervention delay of the protection and avoiding that the primary current $I_{pr}$ through the primary winding 15 reaches high peak values (avoiding for example an excessive heating of the device wherein the electronic ignition system 1 is implemented).

Figure 4A:
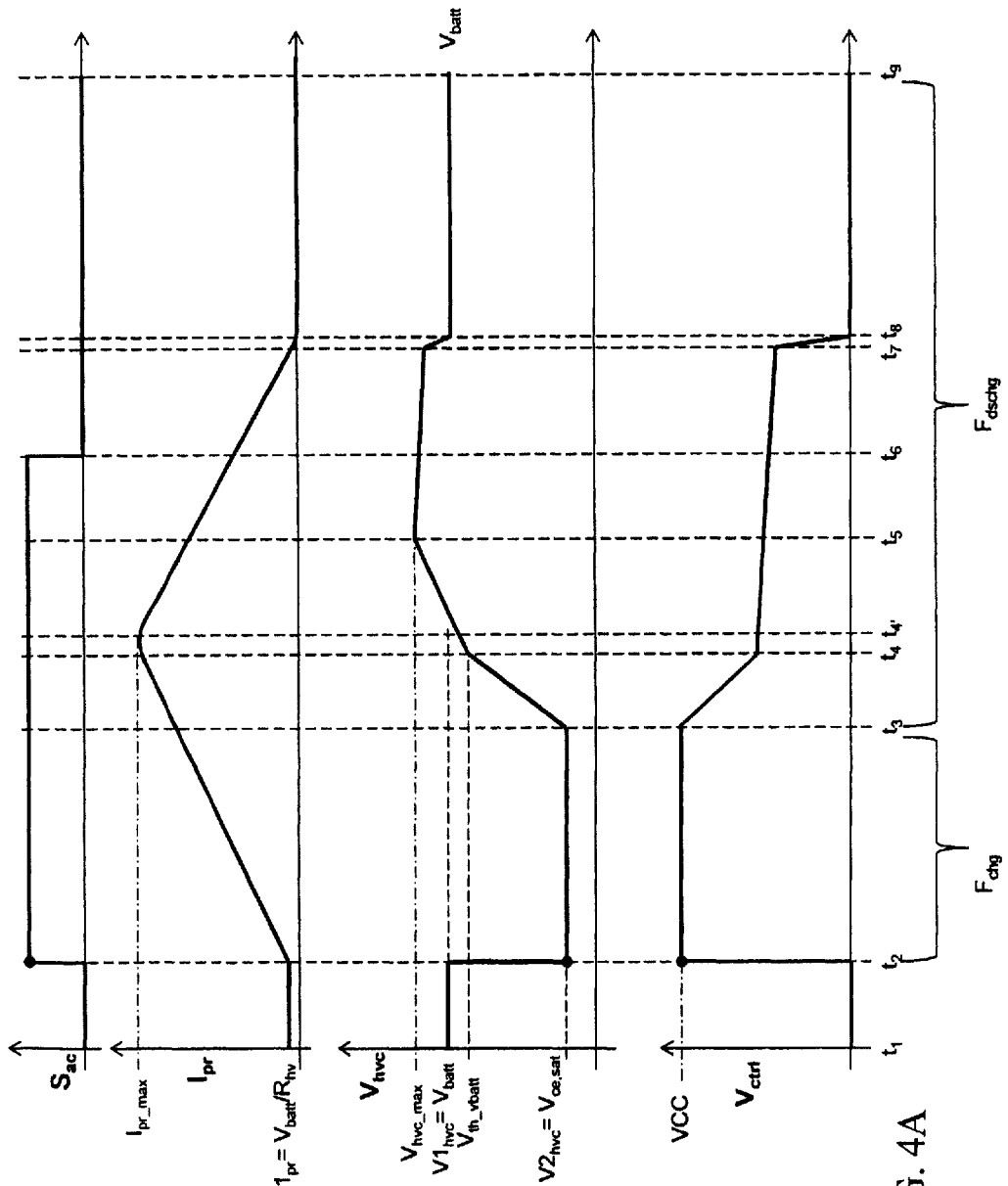
FIGS. 4A-C schematically show a possible trend of some signals used in the electronic ignition system according to an embodiment.

In the second slow discharging phase (see FIG. 2E) the voltage clamping circuit 12 has the function of clamping the primary voltage signal $V_{hvc}$ at the second terminal $I_2$ (and thus at the second terminal of the primary winding 15) to a maximum value $V_{hvc\_max}$ equal to the sum of the battery voltage value $V_{batt}$ and of a further value K (see in FIG. 4A the signal $V_{hvc}$ at the instant $t_5$). The choice of said maximum value $V_{hvc\_max}$ enables to accurately control the slope of the primary current $I_{pr}$ so that this has a gradually substantially decreasing trend, in order to avoid the generation of undesired sparks between the electrodes of plug 6. In fact, if the value of the primary voltage signal $V_{hvc}$ is equal to $V_{hvc} = V_{batt} + K$, the voltage drop $\Delta V_{pr}$ across the primary winding 15 is equal to $\Delta V_{pr} = [V_{hvc} - V_{batt}] = [(V_{batt} + K) - V_{batt}] = K$, that is the voltage drop $\Delta V_{pr}$ across the primary winding 15 is substantially constant, that is it does not depend on the particular value of the battery voltage $V_{batt}$, which could be affected to changes of the value: this enables, by means of the choice of a suitable value K, to accurately control the slope of the primary current $I_{pr}$ flowing through the primary winding 15, so that it has a gradually substantially decreasing trend. In this way it is possible to accurately control the gradual discharge of the energy stored into the primary winding 15, avoiding the generation of undesired sparks at the plug 6. In fact, the voltage drop across the secondary winding 16 is equal to $\Delta V_{sec} = N^* (V_{hvc} - V_{batt}) = N^*(V_{hvc\_max} - V_{batt}) = N^*(V_{batt} + K - V_{batt}) = N^*K$: therefore the value of K is chosen so that the value $N^*K$ is smaller than the value of the voltage drop (across the secondary winding 16) required for striking the spark at the plug 6.

With reference to FIG. 2, it shows in more detail the electronic protection circuit 2 used in the electronic ignition system 1; in particular, FIG. 2 shows in more detail way the voltage clamping circuit 12 used in the electronic protection circuit 2. The voltage clamping circuit 12 comprises:

an input terminal for receiving the safety shut-down enable signal $S_{en\_ssd}$;
a resistor $R_2$;
a resistor $R_{hv}$;
a diode D1;
a Zener diode DZ;
a pnp-type bipolar junction transistor 54;
a current amplifier 52;
a resistor $R_{pd}$ having a value greater than the resistance seen in the third control terminal g;
a voltage comparator 53 such to generate a fast discharge enable signal $S_{en\_sk}$;
a switch 51 controlled by the safety shut-down enable signal $S_{en\_ssd}$;
a switch 57 controlled by the logic NOT of the safety shut-down enable signal $S_{en\_ssd}$;
a switch 56 controlled by the fast discharge enable signal $S_{en\_sk}$;

a threshold generator 55 such to generate a value of a second threshold voltage $V_{th\_Vbatt}$ proportional to the battery voltage $V_{batt}$ and smaller than it, that is $V_{th\_Vbatt}=K1*V_{batt}$; for example, the threshold generator 55 is a resistive divider.

The current amplifier 52 allows having a small value of the slow discharge current $I_{rhv}$: this has the advantage that the value of the primary voltage signal $V_{hvc}$ is clamped to a value $V_{hvc\_max}$ which does not depend on the tolerance of resistor $R_{hv}$ and does not depend on the transconductance of IGBT transistor 30, as it will be explained more in detail in the following in the description relating to the operation of the electronic ignition system 1.

In case the switch 3 is implemented with an IGBT transistor 3, the value of the second threshold voltage $V_{th\_Vbatt}$ is chosen so that it is greater than the maximum saturation voltage $V_{ce,sat}$ of the IGBT transistor 3: this allows to take the IGBT transistor 3 outside the saturation region in the first fast discharging phase, as it will be more explained more in detail in the following in the description relating to the operation of the electronic ignition system 1 (instants comprised between $t_3$ and $t_4'$).

The resistor $R_{hv}$ has the function of monitoring the value of the primary voltage signal $V_{hvc}$. The resistor $R_{hv}$ is of the high-voltage type, that is it's such to be able to tolerate high values of the voltage drop across its terminals (typically, 350-400 V) occurring when the electronic ignition system 1 is in the turn-on phase wherein the spark occurs at plug 6.

The set of the resistor $R_{hv}$, of the diode D1, of the Zener diode DZ, of the transistor 54, of the current amplifier 52, of the switch 51 and of the resistor $R_{pd}$ has the function of forming an electric path wherein, in the second slow discharging phase, the slow discharge current $I_{rhv}$ can flow from the second terminal $I_2$ towards ground and the amplified current $I_{lvc}$ can flow through the resistor $R_{pd}$ towards ground (see the arrow in FIG. 2E), in order to clamp the primary voltage signal $V_{hvc}$ to a maximum value $V_{hvc\_max}$ equal to the sum of battery voltage $V_{batt}$ and a further value K: this allows to accurately control the trend of the primary current $I_{pr}$ so that it takes a gradually substantially decreasing trend in order to perform the safety shut-down of the electronic ignition system 1 by discharging the energy stored into the primary winding 15, thus avoiding the generation of undesired sparks at time instants different from those calculated by the microprocessor 8.

The switch 57 has the function of protecting the components inside the protection circuit 2 during the charging phase and the turn-on phase because it maintains the value of the monitor voltage $V_{rhv}$ to zero, avoiding that the latter reaches high values due to the high values of the primary voltage signal $V_{hvc}$.

Figure 2A:
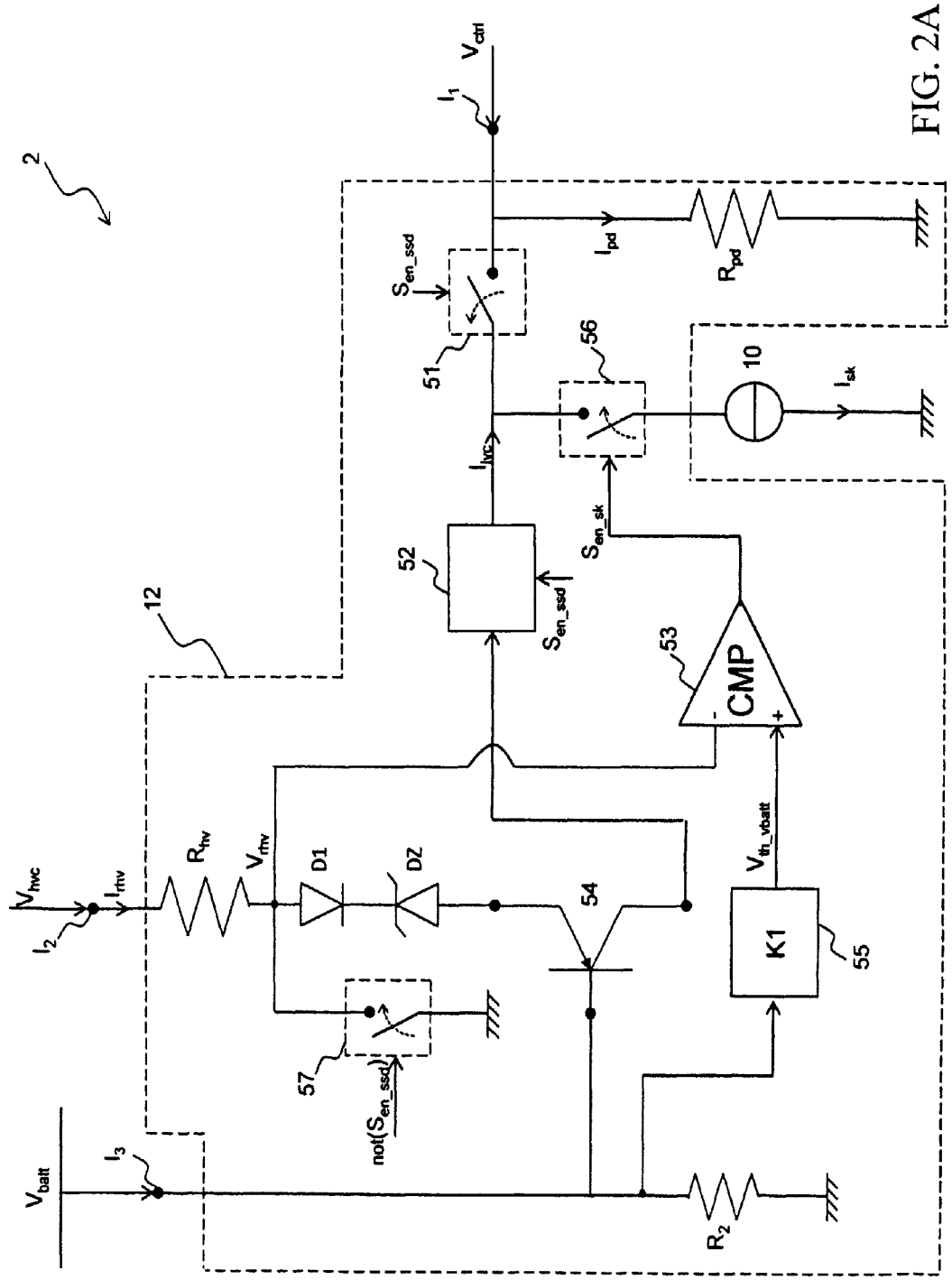
FIGS. 2A-2E schematically show an electronic protection circuit used in the electronic ignition system according to an embodiment.
Figure 2B:
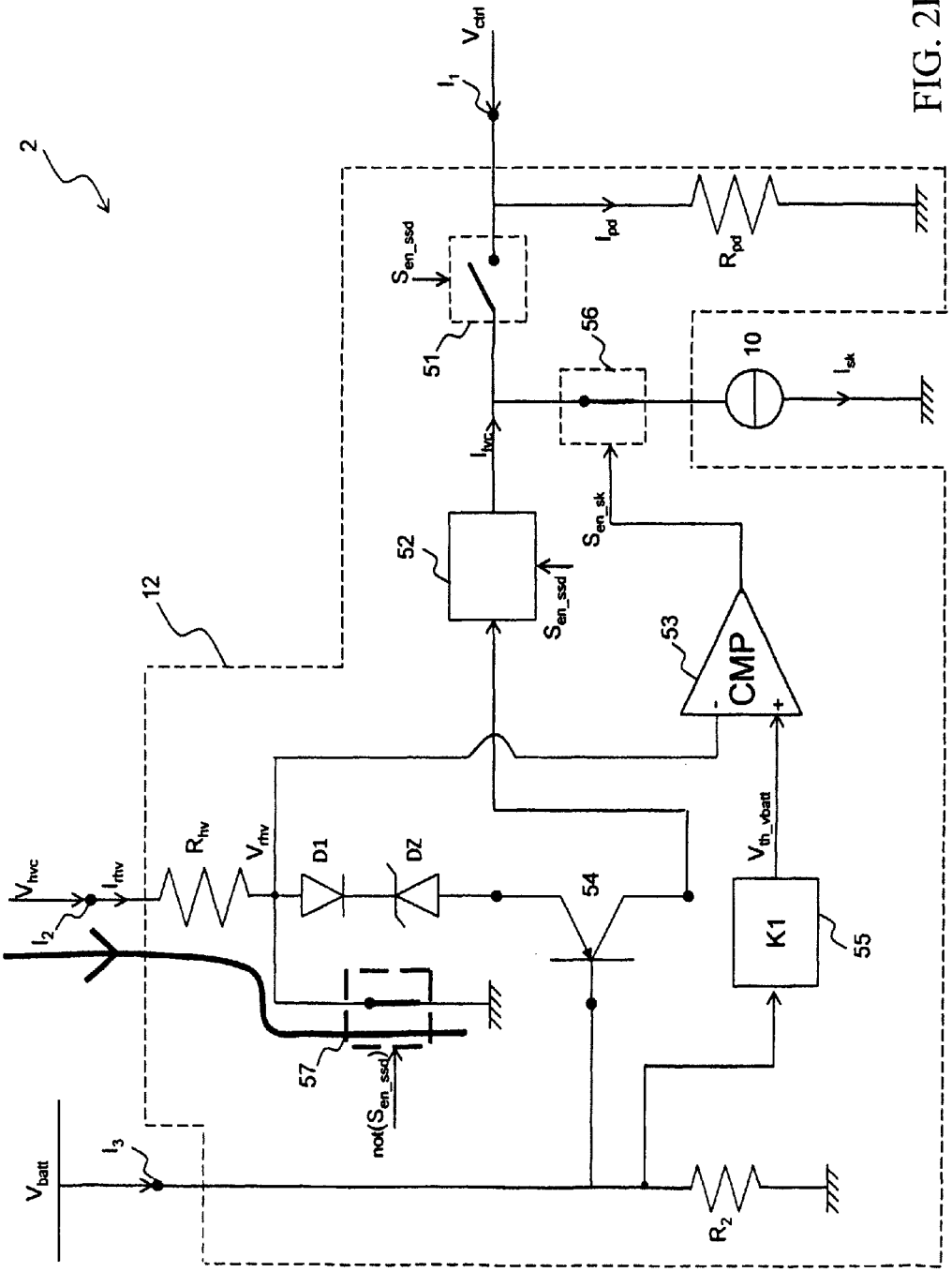

The switch 51 has the function of isolating the protection circuit 2 of the third control terminal g of the switch 3 when the protection circuit 2 is disabled in the charging phase (see FIG. 2B).

In particular:

the resistor $R_2$ has a first terminal connected to the third input terminal $I_3$ and a second terminal connected to ground;

the resistor $R_{hv}$ has a first terminal connected to the second terminal $I_2$ (receiving the primary voltage signal $V_{hvc}$) and a second terminal connected to the diode D1 and having a voltage value referred to in the following as monitoring voltage $V_{rhv}$;

the switch 57 is connected between the second terminal of the resistor $R_{hv}$ and ground and is controlled by the logic NOT of the safety shut-down enable signal $S_{en\_ssd}$;

the diode D1 has the anode connected to the second terminal of resistor $R_{hv}$ and the cathode connected to the Zener diode DZ;

the Zener diode DZ has the cathode connected to the cathode of the Zener diode and the anode connected to the transistor 54;

the transistor 54 has the emitter terminal connected to the anode of Zener diode DZ, the collector terminal connected to the current amplifier 52 and the base terminal connected to the third input terminal $I_3$ (receiving the battery voltage $V_{batt}$);

the current amplifier 52 is supplied by the low supply voltage VCC, has an input terminal connected to the collector of transistor 54, has an output terminal connected to switches 51 and 56 and has a control terminal for receiving the safety shut-down enable signal $S_{en\_ssd}$ for enabling or disabling the operation of current amplifier 52;

the threshold generator 55 has an input terminal connected to the third input terminal $I_3$ and an output terminal connected to the voltage comparator 53;

the voltage comparator 53 has a first input terminal connected to the diode D1 anode and is such to receive the monitoring voltage $V_{rhv}$, it has a second input terminal connected to the output terminal of the threshold generator 55 and such to receive the second threshold voltage $V_{th\_Vbatt}$ and it has an output terminal for generating the fast discharge enable signal $S_{en\_sk}$;

the switch 51 is connected between the output terminal of the current amplifier 52 and the first driving terminal $I_1$ (which carries the control voltage signal $V_{ctrl}$) and is controlled by the safety shut-down enable signal $S_{en\_ssd}$;

the switch 56 is connected between the output terminal of current amplifier 52 and the current generator 10 and is controlled by the fast discharge enable signal $S_{en\_sk}$ (for example, switch 56 is closed when the fast discharge enable signal $S_{en\_sk}$ has a high logic value and is open when the fast discharge enable signal $S_{en\_sk}$ has a low logic value);

the resistor $R_{pd}$ is connected between the first driving terminal $I_1$ and ground.

It is observed that the following components are not essential for the correct operation of the voltage clamping circuit:

the presence of the diode D1 and Zener diode DZ, that is the resistor $R_{hv}$ could be directly connected to the emitter terminal of the transistor 54;

the contemporary presence of the diode D1 and of the Zener diode DZ, that is it can be present D1 and not DZ or, vice versa, it can be present DZ and not D1; alternatively, two or more serially connected diodes D1, D2, D3 . . . or two or more serially connected Zener diodes DZ1, DZ2, DZ3 . . . can be present, or, more in general, a combination of one or more diodes serially connected to one or more Zener diodes;

the current amplifier 52: in this case the collector terminal of the transistor 54 is directly connected to the switch 51;

the switch 57;

the resistor $R_2$, which can be considered as the equivalent resistance towards the battery voltage $V_{batt}$.

With reference to FIG. 3A, it is shown a first example of the current amplifier 52A implementing the current amplifier 52 used in the voltage clamping circuit 12. The current amplifier 52A is implemented with a current mirror using two npn-type bipolar transistors T1, T2 and a resistance $R_{10}$.

With reference to FIG. 3B, it is shown a second example of the current amplifier 52B implementing the current amplifier 52 used in the voltage clamping circuit 12. The current amplifier 52B is implemented with a current mirror using two pnp-type bipolar transistors T3, T4 and a resistance $R_{11}$.

It is observed that the current amplifier 52 can be also implemented with a combination of current amplifiers 52A and 52B.

Figure 4B:
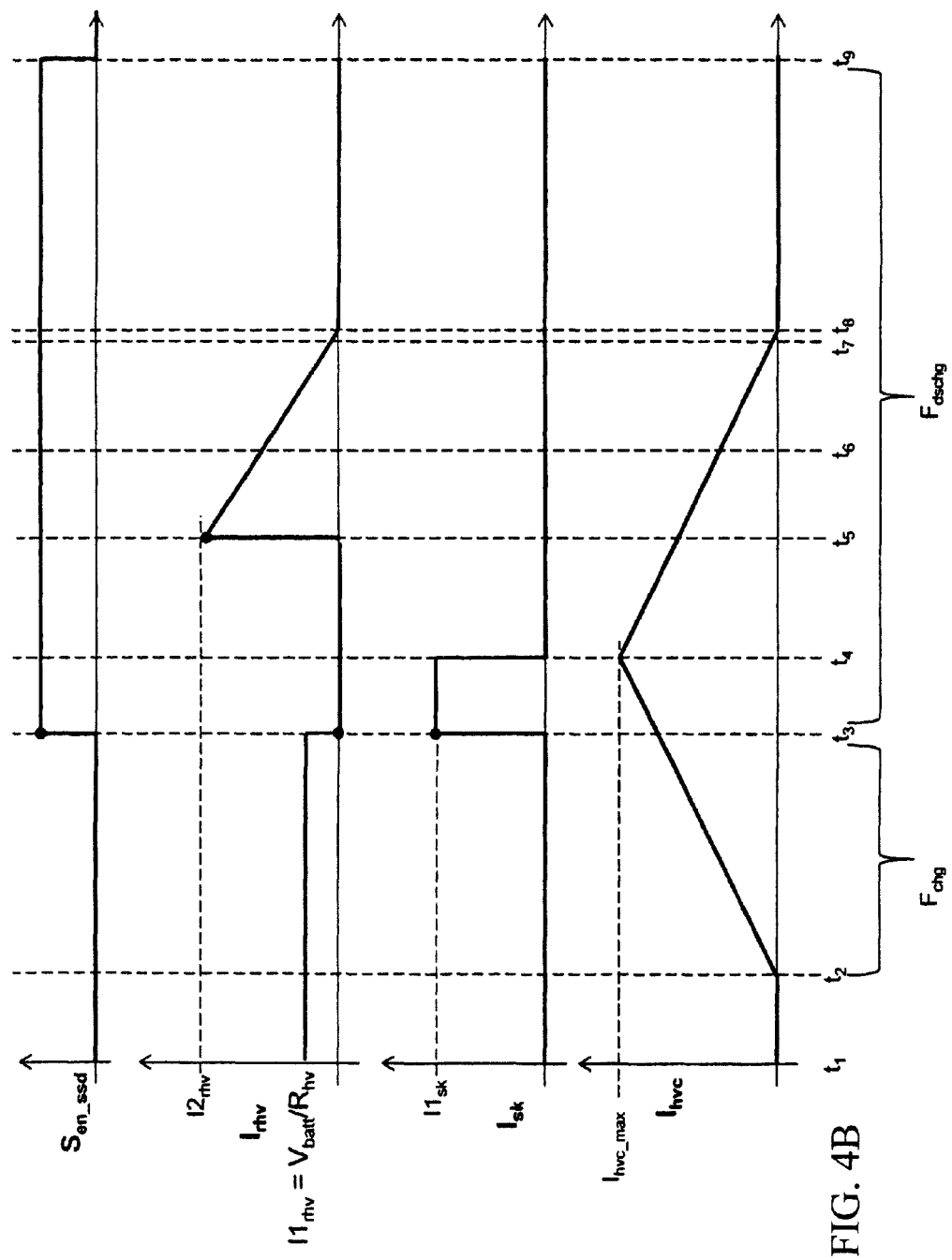
Figure 4C:
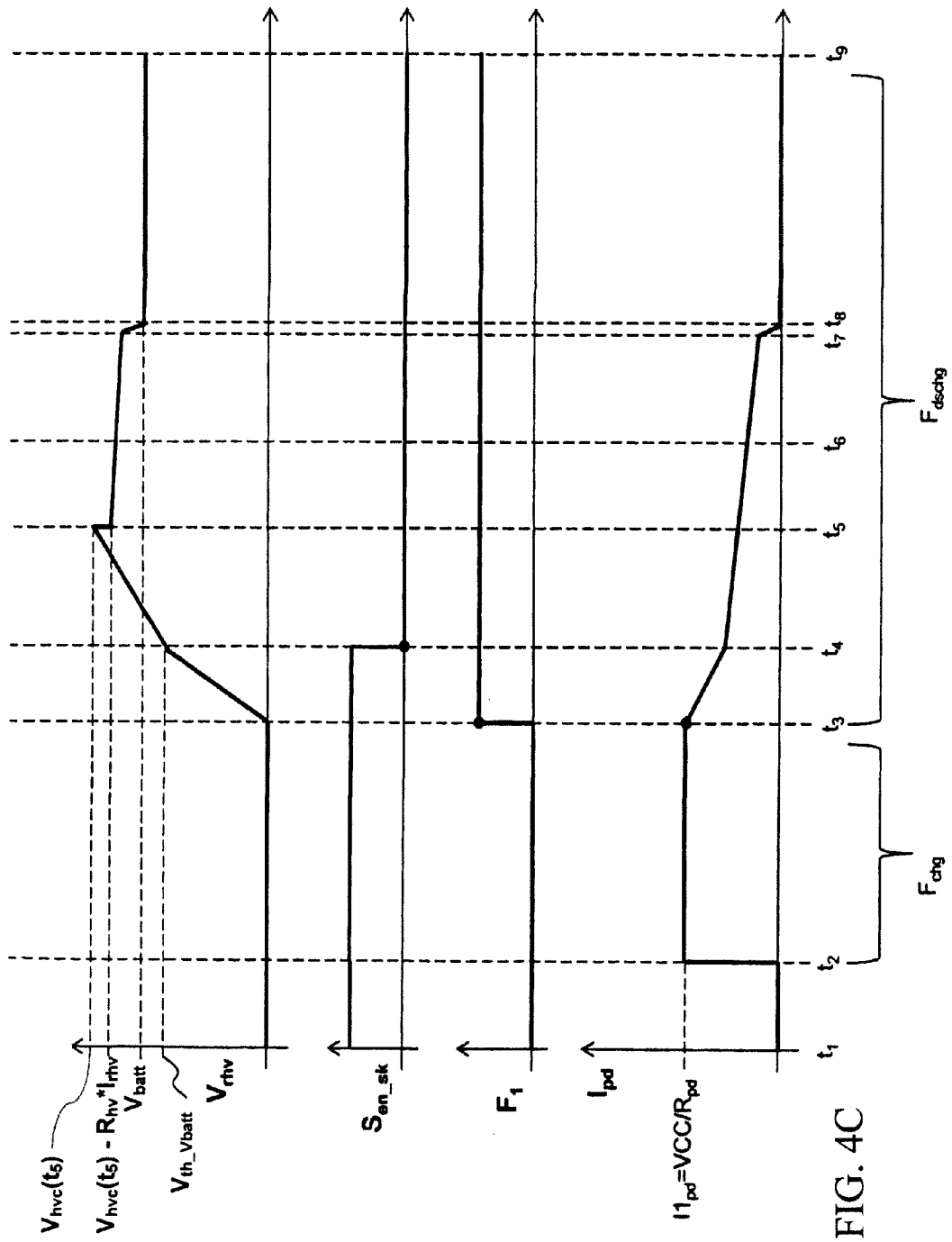

With reference to FIGS. 4A, 4B, 4C, it is shown a possible trend of voltage and current signals of the electronic ignition system 1 during the charging phase and the safety discharging phase, wherein at instant $t_3$ a failure occurs during the charging phase of the primary winding 15.

The charging phase of the primary winding 15 is comprised between instants $t_2$ and $t_3$ and the safety discharging phase of the primary winding 15 is comprised between instants $t_3$ and $t_9$.

It is possible to observe that the primary voltage signal $V_{hvc}$ after instant $t_3$ (wherein the failure occurs) continues to increase till to reach at instant $t5$ a maximum value $V_{hvc\_max}$ which is much smaller than the maximum value which would reach in the presence of the failure and without the presence of the electronic protection circuit 2 and that from instant $t_5$ to instant $t_7$ the primary voltage signal $V_{hvc}$ is substantially constant and equal to the maximum value $V_{hvc\_max}$; the time interval comprised between $t_3$ and $t_5$ is short (for example, comprised between 10 and 30 micro-seconds) and this allows a fast activation of the protection (avoiding, for example, an excessive heating of the device wherein the electronic ignition system 1 is implemented). Moreover, at instants comprised between $t_2$ and $t_4'$ it is possible to note that the primary current $I_{pr}$ and the current $I_{hvc}$ continue to increase till to reach at instant $t_4'$ their respective maximum values $I_{pr\_max}$, $I_{hvc\_max}$ which are much smaller than the respective maximum values which would reach in the presence of the failure and without the presence of the electronic protection circuit 2; from instant $t_4'$ the primary current $I_{pr}$ and the current $I_{hvc}$ have a decreasing trend.

The maximum values $I_{pr\_max}$, $I_{hvc\_max}$ which are smaller reduce the risk of damaging the metal strips on the printed circuit board, wires and the coil 7.

Moreover, it is possible to note that between instants $t_5$ (wherein the primary voltage signal $V_{hvc}$ has reached the maximum value $V_{hvc\_max}$) and $t_7$ the primary voltage signal $V_{hvc}$ has a substantially constant trend equal to the maximum value $V_{hvc\_max}$ which is equal to the sum of the battery voltage $V_{batt}$ and a further value K. As previously explained, the choice of said maximum value $V_{hvc\_max}$ enables to accurately control the slope of the primary current $I_{pr}$ and of the current $I_{hvc}$ so that at instants comprised between $t_5$ and $t_7$ they have a gradually decreasing trend (for example, linear) till to a substantially null value, thus avoiding the generation of undesired sparks between the electrodes of the plug 6.

It is observed that the length of the time intervals $[t_3,t_4]$, $[t_4,t_5]$ and $[t_7,t_8]$ is much smaller than the length of the interval $[t_3,t_8]$.

Figure 2C:
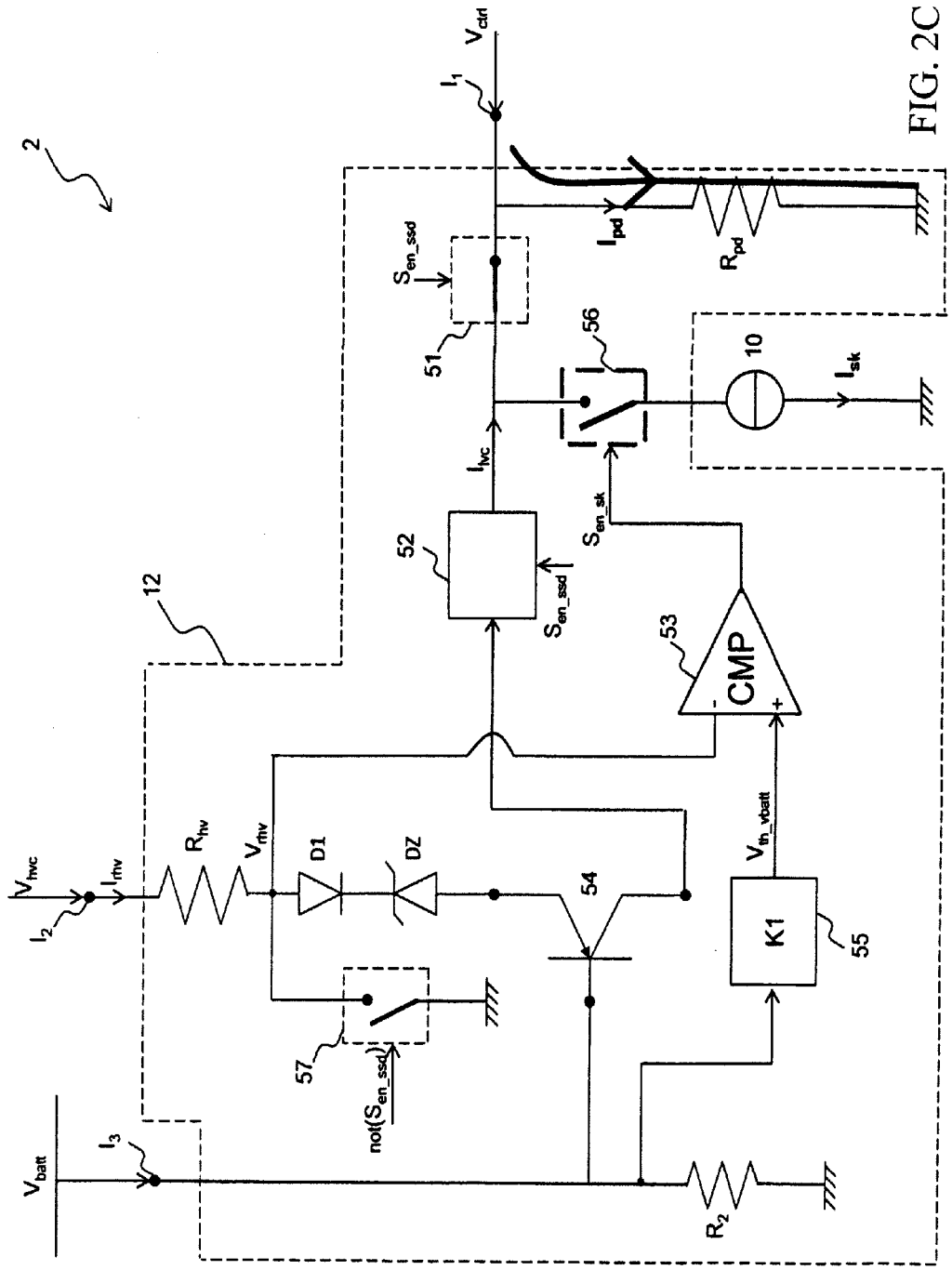
Figure 2D:
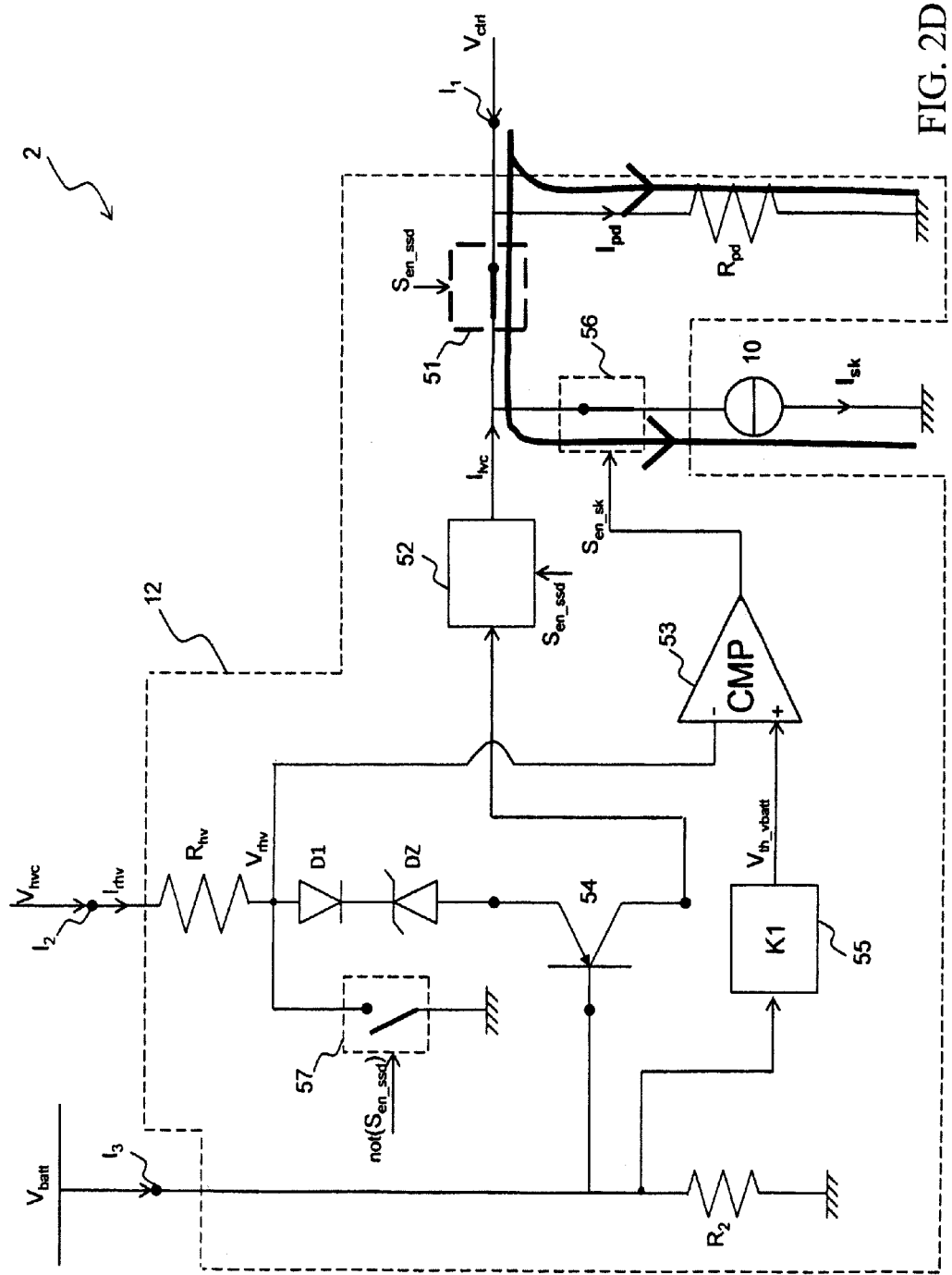
Figure 2E:
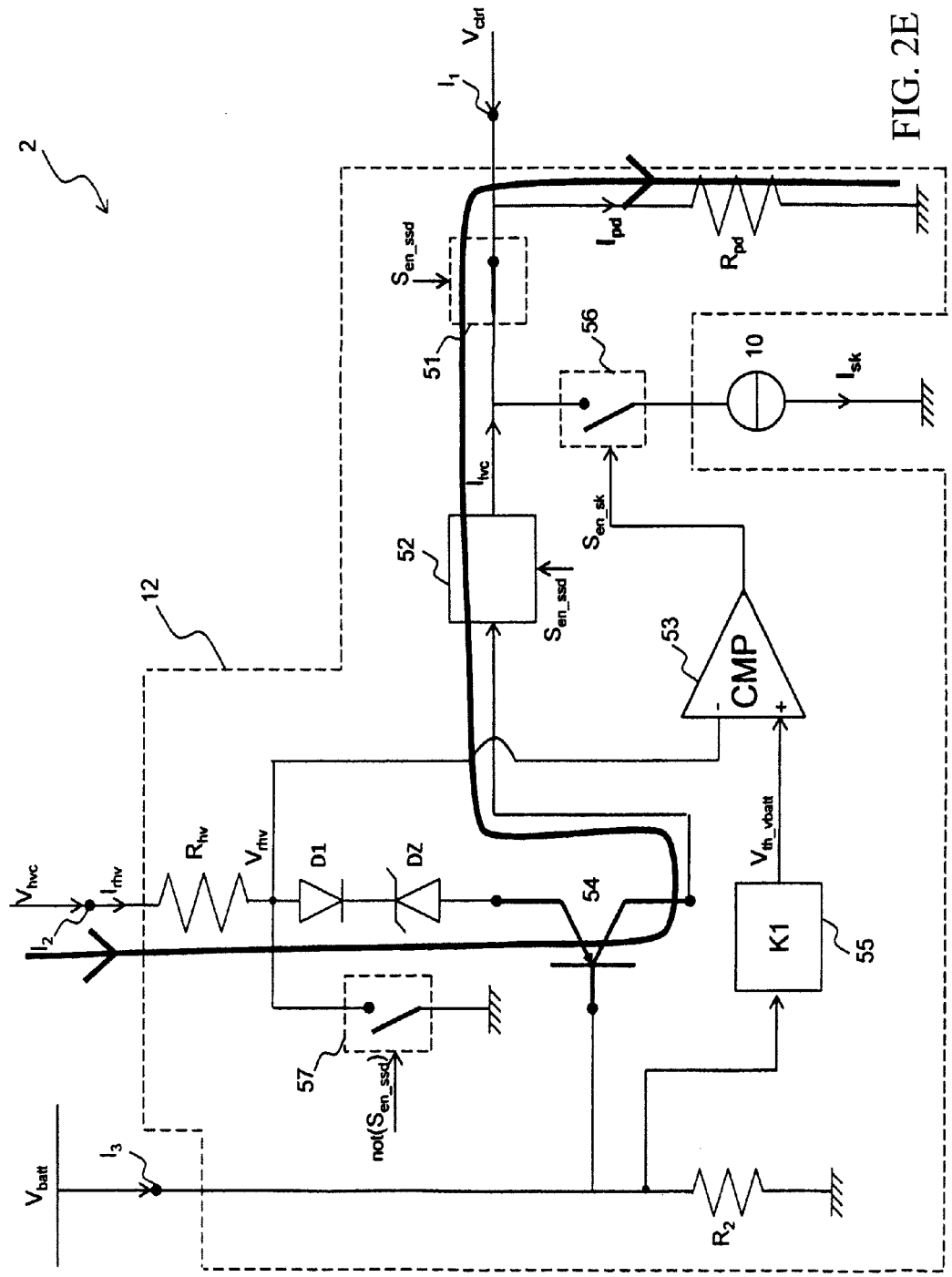

It will be described hereinafter the operation of the electronic ignition system 1 during the charging phase and the safety discharging phase, also referring to FIGS. 1, 2B-2E and 4A-C. In particular:

FIG. 2B shows the operation of the electronic protection circuit 2 at instants comprised between $t_1$ and $t_3$ ($t_3$ excluded);

FIG. 2C shows the operation of the electronic protection circuit 2 at instants comprised between $t_3$ and $t_4$ ($t_4$ excluded);

FIG. 2D shows the operation of the electronic protection circuit 2 at instants comprised between $t_4$ and $t_5$ ($t_5$ excluded);

FIG. 2E shows the operation of the electronic protection circuit 2 at instants comprised between $t_5$ and $t_8$.

For the purpose of explaining the operation, it is assumed that switch 3 is implemented with the IGBT transistor 30 and that the value of the second threshold voltage $V_{th\_Vbatt}$ is substantially greater than the maximum saturation voltage $V_{ce\_sat}$ of the IGBT transistor 3 and is lower than the battery voltage $V_{batt}$ (for example, $V_{ce,sat}=0.2$ V, $V_{batt}=12$ V and $V_{th\_Vbatt}=V_{batt}/2=6$ V).

Instants comprised between $t_1$ and $t_2$ ($t_2$ excluded).

The operation of the electronic protection circuit 2 at instants comprised between $t_1$ and $t_2$ ($t_2$ excluded) is shown in FIG. 2B.

At instants comprised between the starting $t_1$ and instant $t_2$ ($t_2$ excluded) the microprocessor 8 is processing the information received from the sensors relating to the operation of the vehicle engine and generates, as a function of it, the turn-on signal $S_{ac}$ having a low logic value indicating that the spark generation at the plug 6 cannot occur.

The logic circuit 4 receives the turn-on signal $S_{ac}$ having the low logic value, receives the failure signals $F_1$, $F_2$, $F_3$, having low logic values indicating the absence of failures and generates the safety shut-down enable signal $S_{en\_ssd}$ having a low logic value which maintains disabled the electronic protection circuit 2 and generates the gate voltage $V_{ctrl}$ having the low voltage value (0 V) which maintained open the IGBT transistor 30.

The IGBT transistor 30 is open and thus the collector current $T_{rhv}$ is equal to zero.

The protection circuit 2 receives the safety shut-down enable signal $S_{en\_ssd}$ having the low logic signal and is disabled. Therefore the safety shut-down enable signal $S_{en\_ssd}$ has a low logic value, the switch 57 is closed, the switch 51 is open and the current amplifier 57 is disabled.

Since switch 57 is closed, the monitoring voltage value $V_{rhv}$ is equal to zero and thus transistor 54 is open (cut off state); consequently, the primary current $I_{pr}$ flows through the primary winding 15 and the slow discharge current $I_{rhv}$ having value equal to $I1_{pr}=V_{batt}/R_{hv}$ flows only through resistor $R_{hv}$ and the switch 57 towards ground, while current does not flow through transistor 54, as schematically shown in FIG. 2B. Therefore the values of the fast discharge current $I_{sk}$ generated by current generator 10 and of the current $I_{pd}$ through resistor $R_{pd}$ are both equal to zero.

The voltage comparator 53 receives at the negative terminal the monitoring voltage value $V_{rhv}$ equal to zero, receives at the positive terminal the value of the second threshold voltage $V_{th\_Vbatt}$, detects that the monitoring voltage value $V_{rhv}$ is smaller than the value of the second threshold voltage $V_{th\_Vbatt}$ and generates the fast discharge enable signal $S_{en\_sk}$ having a high logic value which closes the switch 56, as shown in FIG. 2B.

Since the IGBT transistor 30 is open, the value $I1_{pr}$ of the primary current $I_{pr}$ is equal to the value $I1_{rhv}$ of the slow discharge current $I_{rhv}$, that is $I_{pr}=I_{rhv}=V_{batt}/R_{hv}=I1_{pr}=I1_{rhv}$, and moreover the value $V1_{hvc}$ of the collector voltage $V_{hvc}$ is equal to the battery voltage $V_{batt}$, that is $V_{hvc}=V1_{hvc}=V_{batt}$.

Since the value of the primary current $I_{pr}$ between $t_1$ and $t_2$ is constant, the value of the secondary current $I_{sec}$ flowing through the secondary winding 16 is equal to zero and also the value of the voltage drop $\Delta V_{pr}$ across the secondary winding 16 is equal to $\Delta V_{sec}=N*(V_{batt}-V_{hvc})=N*(V_{batt}-V_{batt})=0$.

The plug 6 receives the voltage secondary signal $V_{sec}=0$ V and thus the spark at plug 6 is not generated.

Instant $t_2$

The operation of the electronic protection circuit 2 at instant $t_2$ is shown in FIG. 2B.

At instant $t_2$ the microprocessor 8 receives from sensors information relating to the operation of the vehicle engine and generates therefrom the turn-on signal $S_{ac}$ having a transition from the low to the high logic value indicating the start of the charging phase (indicated by $F_{chg}$ in FIGS. 4A-4C) of the primary winding 15 of the coil 7.

The logic circuit 4 receives the turn-on signal $S_{ac}$ having the high logic value, receives the failure signals $F_1$, $F_2$, $F_3$ having the low logic values indicating the absence of failures and generates the safety shut-down enable signal $S_{en\_ssd}$ having a low logic value which maintains disabled the protection circuit 2 and generates the gate voltage $V_{ctrl}$ equal to the value of the low supply voltage VCC which closes the IGBT transistor 30 so that the latter is biased in the saturation region: in this way the collector current $I_{hvc}$ starts flowing through IGBT transistor 3 and the primary current $I_{pr}$ flows through the primary winding 15, thus starting to store energy into the primary winding 15. Moreover, the value of the collector voltage $V_{hvc}$ has a transition from value $V1_{hvc}=V_{batt}$ to a value smaller than $V2_{hvc}=V_{ce,sat}$, wherein $V_{ce,sat}$ is the voltage drop between the collector and emitter of the IGBT transistor 3 biased in the saturation region (for example, $V_{ce,sat}=0.2$ V).

The protection circuit 2 receives the safety shut-down enable signal $S_{en\_ssd}$ having the low logic value and continues to be disabled. Since the safety shut-down enable signal $S_{en\_ssd}$ maintains the low logic value, the switch 57 remains closed and thus the slow discharge current $I_{rhv}$ continues to flow only through resistor $R_{hv}$ and the switch 57 towards ground (as shown in FIG. 2B), having value equal to $I1_{rhv}=V_{batt}/R_{hv}$. The resistance value of the resistor $R_{hv}$ is sufficiently high so that the slow discharge current value $I_{rhv}=I1_{rhv}=V_{batt}/R_{hv}$ is sufficiently low. Moreover, since the safety shut-down enable signal $S_{en\_ssd}$ maintains the low logic value, the switch 51 remains open (isolating the protection circuit 2 from the gate terminal g of the IGBT transistor 30) and the current amplifier 52 remains disabled.

The voltage comparator 53 continues to generate the fast discharge enable signal $S_{en\_sk}$ having the high logic value which maintains the switch 56 closed, as shown in FIG. 2B.

Since the value of monitoring voltage $V_{rhv}$ maintains the value equal to zero, transistor 54 stays open; moreover, since the switch 51 is open and the current amplifier 52 is disabled, the values of the fast discharge current $I_{sk}$ generated by the current generator 10 remain equal to zero. The current $I_{pd}$ through the resistor $R_{pd}$ is supplied by the first output terminal $O_1$ of the logic circuit 4 and it has a transition from the value equal to zero to value $I1_{pd}=V_{ctrl}/R_{pd}=VCC/R_{pd}$.

Instants Comprised Between $t_2$ and $t_3$ ($t_3$ Excluded)

The operation of the electronic protection circuit 2 between instants $t_2$ and $t_3$ ($t_3$ excluded) is shown in FIG. 2B.

The operation of the electronic ignition system 1 at instants comprised between $t_2$ and $t_3$ ($t_3$ excluded) is analogous to the one described at instant $t_2$, thus it continues the charge of energy into the primary winding 15. In particular:

the gate voltage $V_{ctrl}$ maintains the supply low voltage value VCC, which maintains the transistor IGBT biased in the saturation region;

the switch 57 remains closed;

the primary current $I_{pr}$ through the primary winding 15 has an increasing trend;

the collector voltage $V_{hvc}$ maintains the value $V2_{hvc}=V_{ce,sat}$;

the collector current $I_{rhv}$ through the IGBT transistor 3 has an increasing trend;

the slow discharge current $I_{rhv}$ maintains the value $I1_{rhv}=V_{batt}/R_{hv}$.

Instants comprised between $t_3$ and $t_4$ ($t_4$ excluded)

The operation of the electronic protection circuit 2 between instants $t_3$ and $t_4$ ($t_4$ excluded) is shown in FIG. 2C.

At instant $t_3$ the signal $F_1$ has a transition from a low to a high logic value for indicating that a failure occurred.

The micro processor 8 continues to generate the turn-on signal $S_{ac}$ having the high logic value.

The logic circuit 4 receives the turn-on signal $S_{ac}$ having the high logic value, receives the failure signal $F_1$ having the transition from the low logic value to the high logic value and generates the safety shut-down enable signal $S_{en\_ssd}$ having a transition from the low logic value to the high one for enabling the operation of the electronic protection circuit 2: therefore it starts the safety discharging phase (indicated by $F_{dschg}$ in FIGS. 4A-4C). Moreover, the first output terminal $O_1$ of the logic circuit 4 is set to a high impedance state.

In particular, at instant $t_3$ the switch 57 is open, the voltage comparator 53 receives at the negative terminal the monitoring voltage value $V_{rhv}$ equal to zero, receives at the positive terminal the value of the second threshold voltage $V_{th\_vbatt}$, detects that the monitoring voltage value $V_{rhv}$ is smaller than the value of the second threshold voltage $V_{th\_vbatt}$ and continues to generate the fast discharge enable signal $S_{en\_sk}$ having the high logic value which maintains closed the switch 56. Moreover, since the safety shut-down enable signal $S_{en\_ssd}$ has the low logic value, the switch 57 opens, the switch 51 closes and it starts the first fast discharging phase.

Since the value of the monitoring voltage $V_{rhv}$ is equal to zero, transistor 54 remains open.

The safety shut-down enable signal $S_{en\_ssd}$ has the high logic value and thus the current amplifier 52 is enabled, but the amplified current value $I_{lvc}$ at the output of the current amplifier 52 remains equal to zero, because the current value at the input of the current amplifier 52 is zero, since transistor 54 is open.

The safety shut-down enable signal $S_{en\_ssd}$ maintains the high logic value also at the subsequent instants of the safety discharging phase until instant $t_8$, thus at such time instants the switch 57 remains open and the switch 51 remains closed.

Therefore two current flows from the gate terminal g of IGBT transistor 30 to the protection circuit 2 are generated (as schematically shown in FIG. 2C):

a fast discharge current $I_{sk}$ generated from the current generator 10 flowing from the first driving terminal $I_1$ (and thus from the gate terminal g) towards ground, having a value equal to $I1_{sk}$ substantially constant;

a current $I_{pd}$ flowing from the first driving terminal $I_1$ (and thus from gate terminal g) towards ground through the resistor $R_{pd}$, having a value equal to $I1_{pd}=VCC/R_{pd}$ at instant $t_3$ and having a value equal to $V_{ctrl}/R_{pd}$ with a decreasing trend at instants comprised between $t_3$ and $t_4$.

The set of the fast discharge current $I_{sk}$ and of the current $I_{pd}$ has the function of discharging the value of the gate voltage $V_{ctrl}$ of the gate terminal g of the IGBT transistor 30 so that the gate voltage $V_{ctrl}$ has a decreasing trend (see the signal $V_{ctrl}$ in FIG. 4A between instants $t_3$ and $t_4$), in order to quickly take the IGBT transistor 30 outside the saturation region in a short time interval (comprised between $t_3$ and $t_4'$); therefore at instants comprised between $t_3$ and $t_4$ the gate voltage $V_{ctrl}$ has a decreasing trend in order to take the IGBT transistor 30 outside the saturation region and towards the linear operation region.

Since transistor 54 is in the cut off region and switch 57 is open, at instant $t_3$ the slow discharge current $I_{rhv}$ has a transition to value zero, which is maintained until instant $t_5$.

At instants comprised between $t_3$ and $t_4$ the collector voltage $V_{hvc}$ has an increasing trend from value $V2_{hvc}=V_{ce,sat}$, because the gate voltage $V_{ctrl}$ has a decreasing trend.

Analogously, at instants comprised between $t_3$ and $t_4$ the monitoring voltage $V_{rhv}$ has an increasing trend equal to the one of the collector voltage $V_{hvc}$.

At instants comprised between $t_3$ and $t_4$ the IGBT transistor 30 tends to go from the saturation region to the linear operation region, thus the primary current $I_{pr}$ through the primary winding 15 continues to have the increasing trend and the collector current $I_{hvc}$ continues to have the increasing trend.

Instant $t_4$

The operation of the electronic protection circuit 2 at instant $t_4$ is shown in FIG. 2D.

At instant $t_4$, the collector voltage $V_{hvc}$ and the monitoring voltage $V_{rhv}$ reach the value of the second threshold voltage $V_{th\_Vbatt}$; the threshold generator 53 detects that the monitoring voltage $V_{rhv}$ is equal to the second threshold voltage value $V_{th\_Vbatt}$ and generates the fast discharge enable signal $S_{en\_sk}$ having a low logic value which opens the switch 56 and thus it is interrupted the flow of the fast discharge current $I_{sk}$ of current generator 10, as schematically shown in FIG. 2D: now, the IGBT transistor 30 is outside the saturation region and is biased in the linear operation region. In fact, at instants comprised between $t_3$ and $t_4$ the gate voltage $V_{ctrl}$ continues to discharge and the switch 56 opens only when the value of the collector voltage $V_{hvc}$ is equal to (or greater than) the value of the second threshold voltage $V_{th\_Vbatt}$, which is greater than the saturation voltage $V_{ce,sat}$ of the IGBT transistor 3. The fast discharge enable signal $S_{en\_sk}$ maintains the low logic value also in the subsequent instants of the safety discharging phase, thus the switch 56 remains open and the fast discharge current value $I_{sk}$ remains at zero.

The current $I_{pd}=V_{ctrl}/R_{pd}$ continues to flow through resistor $R_{pd}$ and thus the discharge of the gate voltage $V_{ctrl}$ at gate terminal g of the IGBT transistor 30 continues only by means of the contribution of the current given by the current $I_{pd}$.

Moreover, at instant $t_4$ the collector current $I_{hvc}$ reaches a value close to its maximum value $I_{hvc\_max}$: this is obtained by a suitable selection of the value of the second threshold voltage $V_{th\_Vbatt}$ (and thus by a suitable selection of value K1). The IGBT transistor 30 enters the linear operation region at instant $t_4'$ comprised between $t_4$ and $t_5$ (see FIG. 4A) wherein the collector voltage $V_{hvc}$ has reached the battery voltage value $V_{batt}$ and thus it occurs a voltage inversion across the primary winding 15, wherein the interval comprised between $t_4$ and $t_4'$ has a short length; the collector current $I_{hvc}$ continues to increase between instants comprised between $t_4$ and $t_4'$ and reaches the maximum value at instant $t_4'$.

Instants Comprised Between $t_4$ and $t_5$ ($t_5$ Excluded)

The operation of the electronic protection circuit 2 between instants $t_4$ and $t_5$ ($t_5$ excluded) is shown in FIG. 2D.

The operation of the electronic ignition system 1 is analogous to the one described at instant $t_4$, thus it continues the discharge of gate voltage $V_{ctrl}$ at the gate terminal g of IGBT transistor 30 by means of the only contribution of the current $I_{pd}$ through resistor $R_{pd}$, as schematically shown in FIG. 2D.

In particular:

the gate voltage $V_{ctrl}$ continues to have the decreasing trend, but with a slope lower than the slope of the decreasing trend comprised between instants $t_3$ and $t_4'$;

the collector current $I_{hvc}$ has a decreasing trend starting from the maximum value $I_{hvc\_max}$;

the primary current $I_{pr}$ through the primary winding 15 has a decreasing trend;

the collector voltage $V_{hvc}$ and the monitoring voltage $V_{rhv}$ have an increasing trend, but their slope is smaller than the one of the respective signals in the interval comprised between $t_3$ and $t_4$, because the discharge of the gate voltage $V_{ctrl}$ at the gate terminal g occurs only by means of the current $I_{pd}$;

the current value $I_{pd}$ is equal to $V_{ctrl}/R_{pd}$, thus it continues to have a decreasing trend.

Instant $t_5$

The operation of the electronic protection circuit 2 at instant $t_5$ is shown in FIG. 2E.

At instant $t_5$ it starts the second slow discharging phase of the safety discharging phase.

The monitoring voltage $V_{rhv}$ reaches a value greater than the sum of the value of the battery voltage $V_{batt}$ and of the value of the voltage drop $V_{eb\_54}$ between the emitter and the base of the transistor 54 when this operates in a direct active region (typically, $V_{eb\_54}=0.7$ V). Moreover, the collector voltage $V_{hvc}$ reaches the maximum value $V_{hvc\_max}$ equal to the sum of the value of the battery voltage $V_{batt}$ and of a further value K, that is $V_{hvc}(t_5)=V_{hvc\_max}=V_{batt}+K$. These values of the monitoring voltage $V_{rhv}$ and of the collector voltage $V_{hvc}$ activate the transistor 54, which starts conducting, as schematically shown by the arrow in FIG. 2E. In particular, the value K is equal to the sum of the voltage drop $\Delta V_{rhv}=R_{hv}*I_{rhv}$ across the resistor $R_{hv}$, of the voltage drop $V_{D1}$ across the diode D1 (typically, $V_{D1}=0.7$V), of the voltage drop $V_Z$ across the Zener diode DZ (for example, $V_Z=5$ V) and of the voltage drop $V_{eb\_54}$ between the emitter and base of the transistor 54 when this operates in the direct active region (typically, $V_{eb\_54}=0.7$ V), that is $K=\Delta V_{rhv}+V_{D1}+V_Z+V_{eb\_54}$. In the following, clamping voltage $V_{cl}$ indicates the sum of the voltage drop $V_{D1}$ across the diode D1 and of the voltage drop $V_Z$ across the Zener diode DZ, that is $V_{cl}=V_{D1}+V_Z$.

Moreover, since at instant $t_5$ the transistor 54 starts conducting, the slow discharge current $I_{rhv}$ has a transition from the value zero to the value $I2_{rhv}$, wherein said slow discharge current $I_{rhv}$ flows through the resistor $R_{hv}$, the diode D1, the Zener diode DZ, the transistor 54 and the input of current amplifier 52 towards the ground. Therefore a current is injected from the collector terminal c of the IGBT transistor 30 towards the gate terminal g of the IGBT transistor 30 crossing the protection circuit 2: this allows the collector voltage $V_{hvc}$ to remain substantially constant (and equal to the maximum value $V_{hvc\_max}$) and, consequently, allows the collector current $I_{hvc}$ to have a gradually substantially decreasing trend (for example, according to a linear law) towards the value zero.

The current amplifier 52 receives at the input the slow discharge current $I_{rhv}$ and generates at the output an amplified current $I_{lvc}$ by a factor β, that is $I_{lvc}=\beta*I_{rhv}$.

The amplified current $I_{lvc}$ flows through the resistor $R_{pd}$ towards ground, thus $I_{pd}=I_{lvc}$.

It is observed that the maximum value $V_{hvc\_max}$ of the collector voltage $V_{hvc}$ at which transistor 54 starts conducting is equal to $V_{hvc\_max}=V_{batt}+\Delta V_{rhv}+V_{cl}+V_{eb\_54}$, that is it depends on the battery voltage value $V_{batt}$ and on a further value K: as previously explained, the choice of said maximum value $V_{hvc\_max}$ allows to accurately control the slope of the primary current $I_{pr}$ so that at the subsequent instants (comprised between $t_5$ and $t_8$) has a gradually substantially decreasing trend (for example, according to a linear law), thus avoiding the generation of undesired sparks between the electrodes of the plug 6, since the voltage drop across the secondary winding 16 is equal to N*K and is smaller than the value required for generating the spark at the plug 6.

Moreover, it is observed that the maximum value $V_{hvc\_max}$ of the collector voltage $V_{hvc}$ at instant $t_5$ is proportional to the value of the battery voltage $V_{batt}$, thus it's much smaller than the maximum value (for example, 350-400 V) reached without failure (that is at the start of the turn-on phase): this allows to avoid the generation of undesired sparks between the electrodes of the plug 6 at the subsequent instants between $t_5$ and $t_7$, because the maximum value $V_{hvc\_max}$ of the collector voltage $V_{hvc}$ is not sufficient to generate pulses at the secondary voltage $V_{sec}$ such to cause the spark.

Moreover, it is observed that the current generator 10 has been disabled at an instant ($t_4$) preceding the instant ($t_5$)

wherein the clamping of the value of the collector voltage $V_{hvc}$ is activated: this allows to avoid possible overshoots, because it slows down the slope of the increasing trend of the collector voltage $V_{hvc}$ (instants comprised between $t_4$ and $t_5$).

Moreover, it is observed that since at instant $t_5$ the IGBT transistor 30 operates in the linear region, the gate voltage $V_{ctrl}$ depends on the collector current $I_{hvc}$, that is $V_{ctrl}=f(I_{hvc})$. Moreover, it results $V_{ctrl}=R_{pd}*I_{lvc}$; by substituting $V_{ctrl}=f(I_{hvc})$, it is obtained $I_{lvc}=f(I_{hvc})/R_{pd}$. As previously indicated, $V_{hvc}(t_5)=V_{batt}+\Delta V_{rhv}+V_{cl}+V_{eb\_54}=V_{batt}+R_{hv}*I_{rhv}+V_{cl}+V_{eb\_54}$. Since $I_{rhv}=I_{lvc}/\beta$, it is obtained $V_{hvc}(t_5)=V_{batt}+R_{hv}*(I_{lvc}/\beta)+V_{cl}+V_{eb\_54}$. By substituting $I_{lvc}=f(I_{hvc})/R_{pd}$, it is obtained $V_{hvc}(t_5)=V_{batt}+(R_{hv}/R_{pd})*(f(I_{hvc})/\beta)+V_{cl}+V_{eb\_54}=V_{batt}+K$.

Therefore, the value of the collector voltage $V_{hvc}$ at instant $t_5$ is clamped to a value $V_{hvc\_max}$ equal to the sum of the battery voltage value $V_{batt}$ and of a further value K, wherein the value K depends on the clamping voltage $V_{cl}$ (thus on the voltage drop across the diode D1 and on the voltage drop across the Zener diode DZ), on the ratio between the resistance of resistor $R_{hv}$ and the resistance of the resistor $R_{pd}$, on the value of the amplification factor $\beta$ and, to a less extent, on the function $f(I_{hvc})$ of the IGBT transistor 30 in the linear region. Therefore, the presence of the current amplifier 52 allows (see the position of the amplification factor $\beta$ at the denominator of the fraction $f(I_{hvc})/\beta$) to have the collector voltage value $V_{hvc}$ clamped to a value $V_{hvc\_max}$ which does not depend on the transconductance $f(I_{hvc})$ of the IGBT transistor 30.

Preferably, the resistors $R_{hv}$ and $R_{pd}$ are implemented with the same technology and in the same integrated circuit: this allows to accurately control the value of $R_{hv}/R_{pd}$, in order to accurately control also the value of K.

Instants Comprised Between $t_5$ and $t_7$ ($t_7$ Excluded)

The operation of the electronic protection circuit 2 between instants $t_5$ and $t_7$ ($t_7$ excluded) is shown in FIG. 2E.

The operation at instants comprised between $t_5$ and $t_7$ ($t_7$ excluded) is analogous to the one at instant $t_5$, thus current continues to flow from the collector terminal c to the gate terminal g of the IGBT transistor 30 crossing the protection circuit 2, by means of the slow discharge current $I_{rhv}$ through the resistor $R_{hv}$, the diode D1, the Zener diode DZ and the transistor 54 and by means of the current $I_{pd}$ through the resistor $R_{pd}$.

In particular:

the primary current $I_{pr}$ through the primary winding 15 has a gradually decreasing trend till the value zero;

the collector current $I_{hvc}$ has gradually decreasing trend till the value zero;

the collector voltage $V_{hvc}$ has a substantially constant trend (and equal to the maximum value $V_{hvc\_max}$);

the gate voltage $V_{ctrl}$ at the gate terminal g continues to have the trend decreasing towards the value zero;

the slow discharge current $I_{rhv}$ has a gradually decreasing trend towards the value zero;

the current $I_{pd}$ has a gradually decreasing trend towards the value zero.

It is observed that the slope of the gradually substantially decreasing trend of the primary current $I_{pr}$ depends on the value $V_{hvc\_max}$ of the collector voltage $V_{hvc}$ at the instant $t_5$, whose value $V_{hvc\_max}$ has been previously calculated and depends on the clamping voltage $V_{cl}$, on the ratio between the resistance of resistor $R_{hv}$ and the resistance of resistor $R_{pd}$, on the amplification factor $\beta$ and, to a less extent, on the function $f(I_{hvc})$ of the IGBT transistor 30 in the linear region. Therefore, it is possible to control the gradually substantially decreasing trend of the primary current $T_{pr}$ by means of a suitable selection of the following parameters:

the clamping voltage $V_{cl}$ (for example, by using a serial connection of the diode D1 and of the Zener diode DZ); and/or the ratio between the resistance of resistor $R_{hv}$ and the resistance of the resistor $R_{pd}$; and/or the amplification factor $\beta$.

Moreover, the value of these parameters is such to control the length of the time interval comprised between $t_5$ and $t_7$ necessary for performing a safety shut-down of the electronic ignition system 1.

If it is assumed, to a first approximation, that in the linear region the variation of the gate voltage $V_{ctrl}$ of the IGBT transistor 30 is negligible with respect to the value of the gate voltage $V_{ctrl}$ at the instant $t_4$ (due to the high value of the transconductance of the IGBT transistor 30 operating in the linear region), the voltage drop $(V_{hvc}-V_{batt})$ across the primary winding 15 is approximately constant and thus at instants comprised between $t_5$ and $t_7$ the collector current $I_{hvc}$ has a linear decreasing trend: this prevents the generation of undesired sparks between the electrodes of the plug 6 during the second slow discharging phase.

Instant $t_6$

At instant $t_6$ (comprised between $t_5$ and $t_7$) the microprocessor 8 receives from sensors the information regarding the operation of the vehicle engine, calculates that the instant $t_6$ is the one wherein it can occur the spark between the electrodes of the plug 6 in case of absence of failures and generates therefrom the turn-on signal $S_{ac}$ having a transition from the high to the low logic value indicating that (without failures) it can occur the spark between the electrodes of the plug 6.

The logic circuit 4 receives the turn-on signal $S_{ac}$ having the transition from the high to the low logic, receives the failure signal $F_1$ having the high logic value indicating the presence of the failure and generates the safety shut-down enable signal $S_{en\_ssd}$ which maintains high the logic value for maintaining enabled the electronic protection circuit 2.

Therefore the operation at instant $t_6$ is equal to the one previously described at instants comprised between $t_5$ and $t_6$, that is a current continues to flow from the collector terminal c to the gate terminal g of the IGBT transistor 30 through the protection circuit 2.

In particular, it can be observed that the collector voltage $V_{hvc}$ continues to have the substantially constant trend equal to the value $V_{hvc\_max}$, thus the spark between the electrodes of the plug 6 is not generated, because the value of the collector voltage $V_{hvc}$ at the second terminal of the primary winding 15 at instant $t_6$ is not sufficient to generate a secondary voltage value $V_{sec}$ such to generate the spark.

Instants Comprised Between $t_7$ and $t_8$

At instants comprised between $t_7$ and $t_8$ it is completed the discharge of the energy previously stored during the charging phase preceding the failure.

In particular:

the primary current $I_{pr}$ through the primary winding 15 at instant $t_8$ has reached the value zero;

the collector current $I_{hvc}$ at instant $t_8$ has reached the value zero;

the collector voltage $V_{hvc}$ between instant $t_7$ and instant $t_8$ has a transition from the maximum value $V_{hvc\_max}$ to the value of the battery voltage $V_{batt}$;

the slow discharge current $I_{rhv}$ at instant $t_8$ has reached the value zero (which is maintained until instant $t_9$) and, consequently, the current $I_{pd}$ at instant $t_8$ has reached the value zero (which is maintained until instant $t_9$);

the gate voltage $V_{ctrl}$ at the gate terminal g between instant $t_7$ and instant $t_8$ has a transition decreasing towards the value zero.

Instants Comprised Between $t_8$ and $t_9$

At the instants comprised between $t_8$ and $t_9$ the values are the same as the values at instant $t_8$, thus:

the primary current $I_{pr}$ maintains the value zero;

the collector current $I_{hvc}$ maintains the value zero;

the collector voltage $V_{hvc}$ maintains the value of the battery voltage $V_{batt}$;

the slow discharge current $I_{rhv}$ and current $I_{pd}$ maintain the value zero;

the gate voltage $V_{ctrl}$ maintains the value zero.

It is observed that the set of the resistor $R_{hv}$, of the diode D1, of the Zener diode DZ and of the transistor 54 are only an example of an embodiment of a circuit having the function of monitoring the collector voltage value $V_{hvc}$ and of generating a slow discharge current $I_{rhv}$ only when the collector voltage value $V_{hvc}$ is greater than (or equal to) the sum of the value of the battery voltage $V_{batt}$ and of a further value K. The same functionality can be obtained also with other circuits, such as for example a voltage-controlled current generator.

Moreover, it is observed that for the sake of simplicity it has been explained the operation of the electronic ignition system 1 when a failure $F_1$ occurs and thus in case the electronic ignition system 1 has only one transition from the charging phase to the safety discharging phase. More in general, it is possible the occurrence of two or more failures $F_1$, $F_2$, $F_3$ at subsequent time instants and it is possible that such failures disappear: in this case, there are two or more possible transitions of the electronic protection circuit 1 from the charging phase to the safety discharging phase, and vice versa.

For example, first failure $F_1$ occurs and the electronic ignition system 1 has a first transition from the charging phase to the safety discharging phase, wherein the collector voltage value $V_{hvc}$ is clamped to the maximum value $V_{hvc\_max}$ equal to the sum of the value of the battery voltage $V_{batt}$ and of a further value K and the primary current $I_{pr}$ through primary winding 15 has a gradually decreasing trend (as previously explained). Afterwards, failure $F_1$ disappears and the electronic ignition system 1 has a second transition from the safety discharging phase to the charging phase and possibly to the turn-on phase wherein the spark between the plug 6 electrodes is generated at instants calculated by microprocessor 8. Afterwards, failure $F_2$ occurs and the electronic ignition system 1 has a third transition from the charging phase to the safety discharging phase, wherein the value of the collector voltage $V_{hvc}$ is again clamped to the maximum value $V_{hvc\_max}$ equal to the sum of the value of the battery voltage $V_{batt}$ and of a further value K and the primary current $I_{pr}$ through primary winding 15 has a gradually decreasing trend. Afterwards, failure $F_2$ disappears and the electronic ignition system 1 has a fourth transition from the safety discharging phase to the charging phase and possibly to the turn-on phase wherein the spark between the plug 6 electrodes is again generated at instants calculated by the microprocessor 8. Afterwards, failure $F_1$ occurs again and the electronic ignition system 1 has a fifth transition from the charging phase to the safety discharging phase, wherein the collector voltage value $V_{hvc}$ is again clamped to the maximum value $V_{hvc\_max}$ equal to the sum of the value of the battery voltage $V_{batt}$ and of a further value K and the primary current $I_{pr}$ through primary winding 15 has a gradually decreasing trend.

An embodiment also provides integrated circuit. The integrated circuit comprises the electronic system 1 and comprises the logic circuit 4 having the first output terminal $O_1$ connected to the control terminal g of the switch 3 and to the first driving terminal of the electronic circuit 2 and having a second output terminal $O_2$ connected to a fourth input terminal of the electronic circuit 2, wherein the logic circuit is configured to:

in case of absence of failures, generate the control voltage signal for driving the closure of the switch during the charging phase of the primary winding of the transformer and driving the opening of the switch during the discharging phase for generating the spark at the plug;

in case of a detection of a failure, generate the safety shut-down enable signal ($S_{en\_ssd}$) indicating the activation of the safety discharging phase.

An embodiment also provides a vehicle, in particular a motor vehicle, comprising the electronic system 1.

An embodiment also provides a method for discharging a transformer in case of failure during the charging phase of the transformer, said transformer having a primary winding with a first terminal connected to a battery voltage and with a second terminal for generating a primary voltage signal, said primary winding being serially connected to a switch having a control terminal (g) carrying a control voltage signal for opening or closing the switch. The method comprises the steps of:

detecting the failure during the charging phase of the transformer;

generating, during a first phase of a safety discharging phase, a discharge current flowing from the control terminal towards ground in order to discharge the value of the control voltage signal;

clamping, during a second phase of the safety discharging phase subsequent to the first phase, the value of the primary voltage signal to a maximum value substantially equal to the sum of the value of the battery voltage and of a further value.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An electronic system comprising:
   a transformer having a primary winding with a first terminal to be coupled to a battery voltage and a second terminal for generating a primary voltage signal;
   a switch serially coupled to the primary winding and having a control terminal carrying a control voltage signal for opening or closing the switch;
   a first input terminal coupled to the control terminal of the switch;
   a second input terminal coupled to the second terminal of the primary winding and coupled to the switch;
   a third input terminal to be coupled to the battery voltage;
   a fourth input terminal for receiving a safety shut-down enable signal indicating the activation of a safety discharging phase;
   a current generator coupled to the first input terminal and configured to generate, during a first phase of the safety discharging phase, a discharge current flowing from the control terminal towards ground to discharge a value of the control voltage signal;
   a first resistor with a first terminal coupled to the second input terminal and a second terminal of the first resistor carrying a monitoring voltage; and a voltage comparator coupled to the second terminal of the first resistor and configured to compare the value of the monitoring voltage to a threshold voltage value, and to enable the current generator when the value of the monitoring voltage is smaller than the threshold voltage value during the first phase, and to disable the current generator when the value of the monitoring voltage is greater than the threshold voltage value during a second phase.

2. The electronic system according to claim 1, wherein the transformer comprises a secondary winding having a first terminal coupled to the battery voltage and a second terminal coupled to an electrode of a plug, wherein a maximum value of the primary voltage signal is such to prevent the generation of a spark at the plug during the safety discharging phase.

3. The electronic system according to claim 2, further comprising a transistor having a first terminal coupled to the second terminal of the first resistor, having a second terminal for receiving the battery voltage and having a third terminal coupled to the first input terminal;
wherein the transistor starts to conduct in the second phase, when the value of the monitoring voltage is greater than the sum of the value of the battery voltage and a value of activation of the transistor conduction,
and wherein the maximum value depends on the value of activation of the transistor conduction.

4. The electronic system according to claim 3, further comprising at least one diode positioned between the second terminal of the first resistor and the first terminal of the transistor, and
wherein the maximum value depends on the sum of the value of activation of the transistor conduction and on the voltage drop across the at least one diode when conducting.

5. The electronic system according to claim 4, further comprising:
a second resistor coupled between the first input terminal and the ground; and
a current amplifier interposed between the third terminal of the transistor and the first input terminal, wherein the current amplifier, during the second phase, is configured to receive the current generated by the transistor and to generate therefrom an amplified current through the second resistor;
wherein the maximum value depends on the sum of the value of activation of the transistor conduction, of the voltage drop across the at least one diode when conducting and of a ratio between a value of resistance of the first resistor and the second resistor.

6. The electronic system according to claim 5, wherein, during the first phase, a current flows through the second resistor towards ground to discharge the value of the control voltage signal.

7. The electronic system according to claim 1, wherein the current generator is disabled before generating the primary voltage signal.

8. The electronic system according to claim 1, wherein the switch is implemented with an IGBT transistor having a gate terminal equal to the control terminal of the switch, having an emitter terminal coupled towards ground and having a collector terminal coupled to the second terminal of the primary winding,
wherein said IGBT transistor is configured to operate in a saturation region during the first phase and in the linear region during the second phase.

9. The electronic system according to claim 8, wherein the threshold voltage value of the voltage comparator is greater than a maximum saturation voltage of the IGBT transistor.

10. An electronic system comprising a transformer having a primary winding and a secondary winding, a first terminal of the primary winding coupled to a battery voltage and a second terminal for generating a primary voltage signal, the secondary winding having a first terminal coupled to the battery voltage and a second terminal coupled to an electrode of a plug, a switch serially coupled to the primary winding and having a control terminal carrying a control voltage signal for opening or closing the switch, and an integrated circuit, the integrated circuit comprising:
a second input terminal coupled to the second terminal of the primary winding and to the switch;
a fourth input terminal for receiving a safety shut-down enable signal indicating an activation of a safety discharging phase;
a first resistor with a first terminal coupled to the second input terminal and a second terminal of the first resistor carrying a monitoring voltage; and
a voltage comparator coupled to the second terminal of the first resistor and configured to compare a value of the monitoring voltage to a threshold voltage value, and configured to enable a current generator when the value of the monitoring voltage is smaller than the threshold voltage value during a first phase and to disable the current generator when the value of the monitoring voltage is greater than the threshold voltage value during a second phase.

11. The system of claim 10, further comprising:
a logic circuit having a first output terminal coupled to the control terminal of the switch and to the first input terminal and having a second output terminal coupled to the fourth input terminal.

12. The system of claim 11, wherein the logic circuit is configured to:
in case of absence of failures, generate the control voltage signal for driving closure of the switch during a charging phase of the primary winding of the transformer and for driving opening of the switch during a discharging phase for generating a spark at the plug; and
in case of detection of a failure, generate the safety shut-down enable signal indicating activation of a safety discharging phase.

13. A method to discharge an electronic system comprising a transformer having a primary winding with a first terminal coupled to a battery voltage and a second terminal for generating a primary voltage signal, a switch being serially coupled to the primary winding and having a control terminal carrying a control voltage signal, a first input terminal coupled to the control terminal of the switch, a second input terminal coupled to the second terminal of the primary winding and coupled to the switch, a third input terminal coupled to the battery voltage, a fourth input terminal for receiving a safety shut-down enable signal, a current generator coupled to the first input terminal, a first resistor with a first terminal coupled to the second input terminal and a second terminal of the first resistor carrying a monitoring voltage, and a voltage comparator coupled to the second terminal of the first resistor, the method comprising:
generating, during a first phase of the safety discharging phase, a discharge current flowing from the control terminal towards ground to discharge a value of the control voltage signal;
comparing the value of the monitoring voltage to a threshold voltage value; and
enabling the current generator when the value of the monitoring voltage is smaller than the threshold voltage value during the first phase, and;

disabling the current generator when the value of the monitoring voltage is greater than the threshold voltage value during a second phase.

\* \* \* \* \*